United States Patent
Park et al.

(10) Patent No.: US 12,279,477 B2
(45) Date of Patent: Apr. 15, 2025

(54) LOW REFRACTIVE LAYER AND DISPLAY DEVICE

(71) Applicant: Samsung Display Co., Ltd., Yongin-si (KR)

(72) Inventors: Ji Yun Park, Yongin-si (KR); Young Gu Kim, Yongin-si (KR); Bong Sung Seo, Yongin-si (KR); Jong Ho Son, Yongin-si (KR); Yeon Hee Lee, Yongin-si (KR); Baek Kyun Jeon, Yongin-si (KR); Kyung Seon Tak, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 302 days.

(21) Appl. No.: 17/179,947

(22) Filed: Feb. 19, 2021

(65) Prior Publication Data

US 2022/0037623 A1    Feb. 3, 2022

(30) Foreign Application Priority Data

Jul. 30, 2020    (KR) .......................... 10-2020-0095354

(51) Int. Cl.
*H10K 50/858*    (2023.01)
*H10K 50/854*    (2023.01)
(Continued)

(52) U.S. Cl.
CPC ......... *H10K 50/858* (2023.02); *H10K 50/854* (2023.02); *H10K 50/865* (2023.02);
(Continued)

(58) Field of Classification Search
CPC .. H10K 50/858; H10K 50/854; H10K 50/865; H10K 59/12; H10K 59/38; H10K 2102/331
See application file for complete search history.

(56) References Cited

U.S. PATENT DOCUMENTS

2019/0348470 A1*  11/2019  Song .................. H10K 50/86
2020/0081292 A1*  3/2020  Park .................. H05B 33/10
(Continued)

FOREIGN PATENT DOCUMENTS

| JP | 2008-205246 A | 9/2008 |
| JP | 4591403 B2 | 12/2010 |
| JP | 4879629 B2 | 2/2012 |

*Primary Examiner* — Jay C Kim
*Assistant Examiner* — Woo K Lee
(74) *Attorney, Agent, or Firm* — Womble Bond Dickinson (US) LLP

(57) ABSTRACT

A low refractive layer and a display device are provided. The display device includes a plurality of light-emitting elements, a color conversion layer on the light-emitting elements, and a low refractive layer on the color conversion layer, wherein the low refractive layer includes a monomer represented by Formula 1. In Formula 1, $R_1$ and $R_3$ may each independently be a substituted or unsubstituted alkyl group or hydrogen, $R_2$ may be a substituted or unsubstituted alkyl group having two or more carbon atoms, $X_a$, $X_b$, and $X_c$ may each independently be a curable functional group, and n and m may each independently be a natural number in a range of 1 to 5.

Formula 1

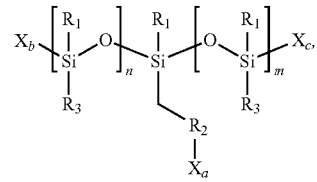

11 Claims, 11 Drawing Sheets

(51) Int. Cl.
*H10K 50/86* (2023.01)
*H10K 59/12* (2023.01)
*H10K 59/38* (2023.01)
*H10K 102/00* (2023.01)

(52) U.S. Cl.
CPC ............. *H10K 59/12* (2023.02); *H10K 59/38* (2023.02); *H10K 2102/331* (2023.02)

(56) References Cited

U.S. PATENT DOCUMENTS

2020/0239732 A1* 7/2020 Shin .................... C09D 183/06
2022/0340778 A1* 10/2022 Negishi ............... C09D 171/00

* cited by examiner

LOW REFRACTIVE LAYER AND DISPLAY DEVICE

CROSS-REFERENCE TO RELATED APPLICATION

This application claims priority to and the benefit of Korean Patent Application No. 10-2020-0095354 filed in the Korean Intellectual Property Office on Jul. 30, 2020, the entire contents of which are hereby incorporated by reference.

BACKGROUND

1. Field

Embodiments of the present disclosure relate to a low refractive layer and a display device.

2. Description of the Related Art

In recent years, interest in information display has increased. Accordingly, research and development for display devices are continuously being conducted.

SUMMARY

An exemplary embodiment of the present disclosure provides a low refractive layer capable of improving display quality and light efficiency, and a display device.

The objects of embodiments of the present disclosure are not limited to the objects described above, and other objects not described above will be obvious to the persons having an ordinary knowledge in this field from the following descriptions.

A display device according to one exemplary embodiment of the present disclosure includes a plurality of light-emitting elements, a color conversion layer on the light-emitting elements, and a low refractive layer on the color conversion layer, wherein the low refractive layer includes a monomer represented by Formula 1 below:

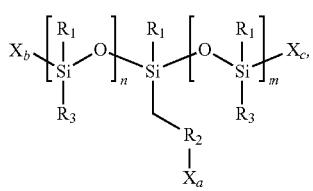

Formula 1 wherein, in Formula 1, $R_1$ and $R_3$ may each independently be a substituted or unsubstituted alkyl group or hydrogen, $R_2$ may be a substituted or unsubstituted alkyl group having two or more carbon atoms, $X_a$, $X_b$, and $X_c$ may each independently be a curable functional group, and n and m may each independently be a natural number in a range of 1 to 5.

The monomer may be included in a content in a range of 3 wt % to 10 wt % with respect to 100 wt % of a solid content of the low refractive layer.

The low refractive layer may further include hollow particles.

The hollow particles may be included in a content in a range of 10 wt % to 80 wt % with respect to 100 wt % of a solid content of the low refractive layer.

The curable functional group may include at least one selected from a methacrylate group, an acrylate group, a vinyl group, and an epoxy group.

The display device may further include an inorganic layer between the color conversion layer and the low refractive layer.

The display device may further include a color filter layer overlapping the color conversion layer, and the low refractive layer may be between the color conversion layer and the color filter layer.

The display device may further include an inorganic layer between the color filter layer and the low refractive layer.

The inorganic layer may include at least one selected from silicon oxide ($SiO_x$), silicon nitride ($SiN_x$), silicon oxynitride ($SiO_xN_y$), aluminum oxide ($AlO_x$), and titanium oxide ($TiO_x$).

The color conversion layer may include a base resin and quantum dots dispersed in the base resin.

Each of the light-emitting elements may include a first semiconductor layer, a second semiconductor layer on the first semiconductor layer, and an active layer between the first semiconductor layer and the second semiconductor layer.

A low refractive layer according to one exemplary embodiment of the present disclosure includes a monomer represented by Formula 1 below:

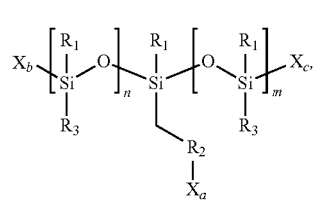

Formula 1 wherein, in Formula 1, $R_1$ and $R_3$ may each independently be a substituted or unsubstituted alkyl group or hydrogen, $R_2$ may be a substituted or unsubstituted alkyl group having two or more carbon atoms, $X_a$, $X_b$, and $X_c$ may each independently be a curable functional group, and n and m may each independently be a natural number in a range of 1 to 5.

The monomer may be included in a content in a range of 3 wt % to 10 wt % with respect to 100 wt % of a solid content of the low refractive layer.

The low refractive layer may further include hollow particles.

The hollow particles may be included in a content in a range of 10 wt % to 80 wt % with respect to 100 wt % of a solid content of the low refractive layer.

The hollow particles may have a diameter in a range of 10 nm to 200 nm, and a shell of the hollow particles may have a thickness in a range of 5 nm to 50 nm.

The hollow particles may include hollow silica.

The hollow particles may include at least one selected from acrylic, polyimide, urethane, styrene, siloxane, and epoxy on surfaces thereof.

The low refractive layer may further include at least one selected from a curing agent, a photopolymerization initiator, and an ultraviolet absorber.

The curable functional group may include at least one selected from a methacrylate group, an acrylate group, a vinyl group, and an epoxy group.

Other features of the exemplary embodiments are included in the detailed description and the drawings.

BRIEF DESCRIPTION OF THE DRAWINGS

The accompanying drawings, together with the specification, illustrate embodiments of the subject matter of the present disclosure, and, together with the description, serve to explain principles of embodiments of the subject matter of the present disclosure.

DETAILED DESCRIPTION

Figure 1:
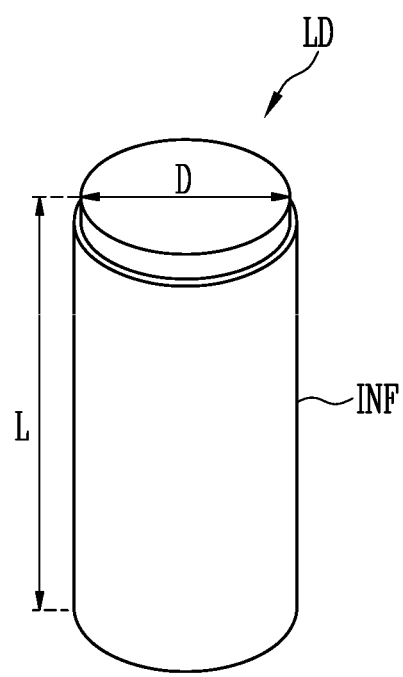
FIGS. 1 and 2 are a perspective and a cross-sectional view illustrating a light-emitting element according to one exemplary embodiment.

The features of the present disclosure and methods of achieving the features will be described more fully with reference to the accompanying drawings, in which exemplary embodiments of the disclosure are shown. However, the present disclosure is not limited to exemplary embodiments set forth herein and may be realized in various forms. The exemplary embodiments are merely provided to make the disclosure of the present disclosure complete and to make those having ordinary knowledge in the art to which the present disclosure pertains completely understand the scope of the present disclosure. The scope of the present disclosure is defined only by the scope of the appended claims, and equivalents thereof.

The terms used in the present specification are intended to explain the exemplary embodiments but are not intended to limit the present disclosure. As used herein, the singular forms "a," "an," and "the" are intended to include the plural forms as well, unless the context clearly indicates otherwise. It will be further understood that the terms "comprises," "comprising," "includes," and/or "including," if used herein, specify the presence of stated components, steps, operations, and/or elements, but do not preclude the presence or addition of one or more other components, steps, operations, and/or elements.

In addition, the term "connection" or "coupling" may mean a physical and/or electrical connection or coupling. Furthermore, the term may mean a direct or indirect connection or coupling and an integral or non-integral connection or coupling.

It will be understood that when an element or a layer is referred to as being "on" or "above" another element or layer, it can be directly on or above another element or layer or intervening elements or layers may be present. Like reference numerals refer to like elements throughout the specification.

It should be understood that, although terms such as "first," "second," and the like may be used herein to describe various components, these components are not limited by these terms. These terms are only used to distinguish one element or component from another element or component. Therefore, a first component described below could be termed a second component without departing from the scope and spirit of the present disclosure.

Hereinafter, exemplary embodiments of the present disclosure will be described in more detail with reference to the accompanying drawings.

Figure 2:
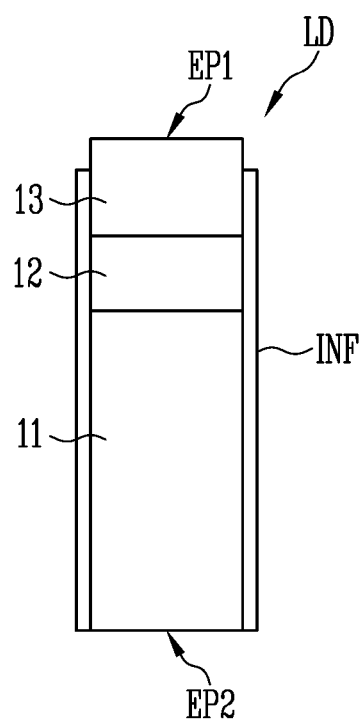

FIGS. 1 and 2 are a perspective and a cross-sectional view illustrating a light-emitting element according to one exemplary embodiment. A rod-shaped light-emitting element LD having a circular columnar shape is illustrated in FIGS. 1 and 2, but the type (or kind) and/or shape of the light-emitting element LD are not limited thereto.

Referring to FIGS. 1 and 2, the light-emitting element LD may include a first semiconductor layer 11, a second semiconductor layer 13, and an active layer 12 interposed between the first semiconductor layer 11 and the second semiconductor layer 13. As an example, when an extending direction of the light-emitting element LD is regarded as a direction of a length L, the light-emitting element LD may include the first semiconductor layer 11, the active layer 12, and the second semiconductor layer 13 which are sequentially stacked in the direction of the length L.

The light-emitting element LD may be provided in a rod shape extending in one direction. The light-emitting element LD may include a first end EP1 and a second end EP2. One selected from the first and second semiconductor layers 11 and 13 may be at the first end EP1 of the light-emitting element LD. The other of the first and second semiconductor layers 11 and 13 may be at the second end EP2 of the light-emitting element LD.

According to exemplary embodiments, the light-emitting element LD may be a rod-shaped light-emitting element (also referred to as a "rod-shaped light-emitting diode") manufactured in a rod shape through an etching method and/or the like. In the present specification, the term "rod shape" includes all of a rod-like shape and a bar-like shape, such as a circular column and a polygonal column, which are long in the direction of the length L (e.g., have an aspect ratio greater than one). A shape of a cross section of the rod shape is not particularly limited. For example, the length L1 of the light-emitting element LD may be greater than a diameter D (or a width of a cross section) thereof.

The light-emitting element LD may have a small size a range of a nanoscale to a microscale. As an example, the light-emitting element LD may have the diameter D (or width) and/or the length L1, which each range from a nanoscale to a microscale. However, the size of the light-emitting element LD is not limited thereto. The size of the light-emitting element LD may be variously changed according to design conditions of various devices, for example, a display device which uses a light-emitting device including the light-emitting element LD as a light source.

The first semiconductor layer 11 may be a first-conductivity type semiconductor layer. For example, the first semiconductor layer 11 may include an N-type semiconductor layer. As an example, the first semiconductor layer 11 may include an N-type semiconductor layer which includes any one semiconductor material selected from InAlGaN, GaN, AlGaN, InGaN, AlN, and InN and is doped with a first-conductivity type dopant such as silicon (Si), germanium (Ge), tin (Sn), and/or the like. However, the material constituting the first semiconductor layer 11 is not limited thereto, and the first semiconductor layer 11 may be made of various materials.

The active layer 12 may be on the first semiconductor layer 11 and may be formed to have a single-quantum well or multi-quantum well structure. The position of the active layer 12 may be variously changed according to the type (or kind) of the light-emitting element LD.

A cladding layer doped with a conductive dopant may be formed on and/or below the active layer 12. As an example, the clad layer may be formed as an AlGaN layer and/or an InAlGaN layer. According to exemplary embodiments, a material such as AlGaN and/or InAlGaN may be used to form the active layer 12, and in addition, various materials may constitute the active layer 12.

The second semiconductor layer 13 may be on the active layer 12 and may include a semiconductor layer having a type different from that of the first semiconductor layer 11. For example, the second semiconductor layer 13 may include a P-type semiconductor layer. As an example, the second semiconductor layer 13 may include a P-type semiconductor layer which includes any one semiconductor material selected from InAlGaN, GaN, AlGaN, InGaN, AlN, and InN and is doped with a second-conductivity type dopant such as magnesium (Mg). However, the material constituting the second semiconductor layer 13 is not limited thereto, and the second semiconductor layer 13 may be made of various materials.

In one exemplary example, the first semiconductor layer 11 and the second semiconductor layer 13 may have different lengths (or thicknesses) in the direction of the length L of the light-emitting element LD. As an example, the first semiconductor layer 11 may have a length (or thickness) that is relatively greater than that of the second semiconductor layer 13 in the direction of the length L of the light-emitting element LD. Accordingly, when the second semiconductor layer 13 is at the first end EP1 and the first semiconductor layer 11 is at the second end EP2, the active layer 12 of the light-emitting element LD may be positioned closer to the first end EP1 than the second end EP2.

When a voltage greater than or equal to a threshold voltage is applied to both ends of the light-emitting element LD, electrons and holes are combined with each other in the active layer 12, and thus, the light-emitting elements LD emits light. By controlling light emission of the light-emitting element LD using such a principle, the light-emitting element LD may be used as a light source of various light-emitting devices, such as a light source of a pixel of a display device.

The light-emitting element LD may further include an insulating film INF provided on a surface thereof. The insulating film INF may be formed on the surface of the light-emitting element LD so as to surround at least an outer peripheral (e.g., circumferential) surface of the active layer 12. In addition, the insulating film INF may further surround one region of each of the first and second semiconductor layers 11 and 13.

According to exemplary embodiments, the insulating film INF may expose both ends of the light emitting element LD which have different polarities. For example, the insulating film INF may expose one end of each of the first and second semiconductor layers 11 and 13 positioned at the first and second ends EP1 and EP2 of the light-emitting element LD. In another exemplary embodiment, the insulating film INF may expose side portions of the first and second semiconductor layers 11 and 13 adjacent to the first and second ends EP1 and EP2 of the light-emitting element LD which have different polarities.

According to exemplary embodiments, the insulating film INF may be formed as a single-layer or a multi-layer including at least one insulating material selected from silicon oxide ($SiO_x$), silicon nitride ($SiN_x$), aluminum oxide ($AlO_x$), and titanium oxide ($TiO_x$) (for example, a double layer made of aluminum oxide ($AlO_x$) and silicon oxide ($SiO_x$)), but the present disclosure is not necessarily limited thereto. According to exemplary embodiments, the insulating film INF may be removed or omitted.

When the insulating film INF is provided to cover the surface of the light-emitting element LD, for example, the outer peripheral (e.g., circumferential) surface of the active layer 12, it is possible to prevent or reduce short-circuits of the active layer 12 with a first pixel electrode or second pixel electrode to be further described below. Accordingly, electrical stability of the light-emitting element LD may be secured.

In addition, when the insulating film INF is provided on the surface of the light-emitting element LD, surface defects of the light-emitting element LD may be minimized or reduced, thereby improving a lifetime and efficiency of the light-emitting element LD. In addition, even when a plurality of light-emitting elements LD are close to each other, occurrence of an undesirable short circuit between the light-emitting elements LD may be prevented or reduced.

In one exemplary embodiment, the light-emitting element LD may further include additional components in addition to the first semiconductor layer 11, the active layer 12, the second semiconductor layer 13, and/or the insulating film INF surrounding the first semiconductor layer 11, the active layer 12, and the second semiconductor layer 13. For example, the light-emitting element LD may additionally include at least one fluorescent layer, active layer, semiconductor layer, and/or electrode layer at one end side of the first semiconductor layer 11, the active layer 12, and/or the second semiconductor layer 13. As an example, electrode layers may be at the first and second ends EP1 and EP2 of the light-emitting element LD. The electrode layers may be ohmic contact electrodes, but the present disclosure is not necessarily limited thereto. The electrode layers may be schottky contact electrodes (e.g., an electrode at a metal-semiconductor junction). In some embodiments, in FIGS. 1 and 2, the rod-shaped light-emitting element LD is illustrated, but the type (or kind), structure, and/or shape of the light-emitting element LD may be variously changed. For example, the light-emitting element LD may be formed in a core-shell structure having a polypyramid shape.

A light-emitting device including the light-emitting element LD described above may be used in various types (or kinds) of devices including a display device, which require a light source. For example, the plurality of light-emitting elements LD may be in each pixel of a display panel, and the light-emitting element LD may be used as a light source of each pixel. However, the application field of the light-emitting element LD is not limited to the above-described example. For example, the light-emitting element LD may be used in other types (or kinds) of devices, such as a lighting device, which require a light source.

Figure 3:
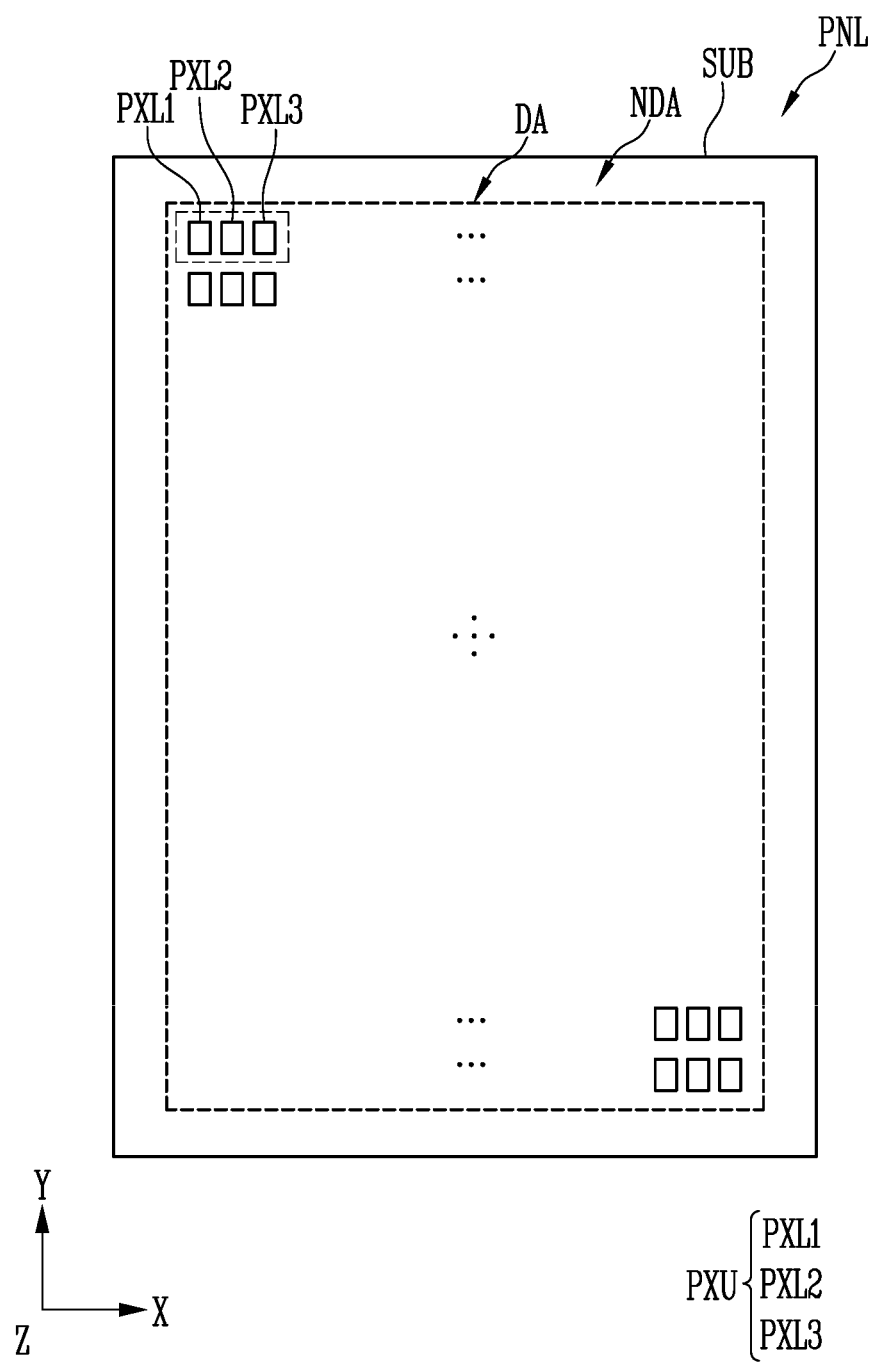
FIG. 3 is a plan view illustrating a display device according to one exemplary embodiment.

FIG. 3 is a plan view illustrating a display device according to one exemplary embodiment.

As an example of an electronic device which may use the light-emitting element LD described in the exemplary embodiments of FIGS. 1 and 2 as a light source, a display device, for example, a display panel PNL included in the display device is illustrated in FIG. 3. However, the present disclosure is not necessarily limited thereto, and the display panel PNL may use various light-emitting elements, such as an organic light-emitting diode (OLED) including an organic light-emitting layer, as a light source.

Each pixel unit PXU of the display panel PNL and each of pixels constituting the same may include one or more light-emitting elements LD. For convenience, the structure of the display panel PNL is briefly illustrated in FIG. 3 based on a display area DA. However, according to exemplary embodiments, at least one driving circuit unit (for example, at least one selected from a scan driver and a data driver), lines, and pads, may be further in the display panel PNL.

Referring to FIG. 3, the display panel PNL may include a substrate SUB and the pixel units PXU on the substrate SUB. The pixel units PXU may include first pixels PXL1, second pixels PXL2, and/or third pixels PXL3. Hereinafter, when at least one pixel of the first pixels PXL1, the second pixels PXL2, and the third pixels PXL3 is arbitrarily described, the pixel will be referred to as "pixel PXL," or when at least two pixels thereof are collectively described, the pixels will be referred to as "pixels PXL."

The substrate SUB may constitute a base member of the display panel PNL and may be a rigid and/or flexible substrate and/or film. As an example, the substrate SUB may be a rigid substrate made of glass and/or tempered glass, a flexible substrate (or thin film) made of plastic and/or metal, or at least one insulating layer. The material and/or physical properties of the substrate SUB are not particularly limited.

In one exemplary embodiment, the substrate SUB may be substantially transparent. Here, the term "substantially transparent" may mean that light can be transmitted at a set or predetermined transmittance or more. In another exemplary embodiment, the substrate SUB may be semi-transparent or opaque. In addition, the substrate SUB may include a reflective material according to exemplary embodiments.

The display panel PNL and the substrate SUB for forming the same may include the display area DA for displaying an image and a non-display area NDA excluding the display area DA.

The pixels PXL may be in the display area DA. Various lines, pads, and/or an embedded circuit unit coupled to the pixels PXL of the display area DA may be in the non-display area NDA. The pixels PXL may be regularly arranged according to a stripe and/or PENTILE® arrangement structure (PENTILE® is a registered trademark of Samsung Display Co., Ltd.). However, the arrangement structure of the pixels PXL is not limited thereto, and the pixels PXL may be arranged in the display area DA in various structures and/or manners.

According to exemplary embodiments, two or more types (or kinds) of pixels PXL emitting light having different colors may be in the display area DA. As an example, the first pixels PXL1 emitting first color light, the second pixels PXL2 emitting second color light, and the third pixels PXL3 emitting third color light may be arranged in the display area DA. At least one first pixel PXL1, at least one second pixel PXL2, and at least one third pixel PXL3 adjacent to each other may constitute one pixel unit PXU capable of emitting light having various colors. For example, the first to third pixels PXL1, PXL2, and PXL3 may be subpixels which each emit light having a set or predetermined color. According to exemplary embodiments, the first pixel PXL1 may be a red pixel which emits red light, the second pixel PXL2 may be a green pixel which emits green light, and the third pixel PXL3 may be a blue pixel which emits blue light, but the present disclosure is not limited thereto.

In one exemplary embodiment, the first pixel PXL1, the second pixel PXL2, and the third pixel PXL3 may respectively include a first color light-emitting element, a second color light-emitting element, and a third color light-emitting element as a light source to respectively emit first color light, second color light, and third color light. In another exemplary embodiment, the first pixel PXL1, the second pixel PXL2, and the third pixel PXL3 may include light-emitting elements which emit the same (e.g., substantially the same) color light. In addition, the first pixel PXL1, the second pixel PXL2, and the third pixel PXL3 may include color conversion layers and/or color filters having different colors, which are on the light-emitting elements, thereby emitting first color light, second color light, and third color light. However, the color, type (or kind), and/or number of the pixels PXL constituting each pixel unit PXU are not particularly limited. For example, the color of the light emitted by each pixel PXL may be variously changed.

The pixel PXL may include at least one light source driven by set or predetermined control signals (for example, a scan signal and a data signal) and/or set or predetermined power sources (for example, a first power source and a second power source). In one exemplary embodiment, the light source may include one or more light-emitting elements LD according to any one of the exemplary embodiments of FIGS. 1 and 2, for example, micro light-emitting elements LD having a small size in a range of a nanoscale to a microscale. However, the present disclosure is not necessarily limited thereto, and in addition, various types (or kinds) of light-emitting elements LD may be used as the light source of the pixel PXL.

In one exemplary embodiment, each pixel PXL may be formed as an active pixel. However, the type (or kind), structure, and/or driving method of the pixels PXL applicable to a display device are not particularly limited. For example, each pixel PXL having various structures and/or driving methods may be formed as a pixel of a passive or active light-emitting display device.

Figure 4:
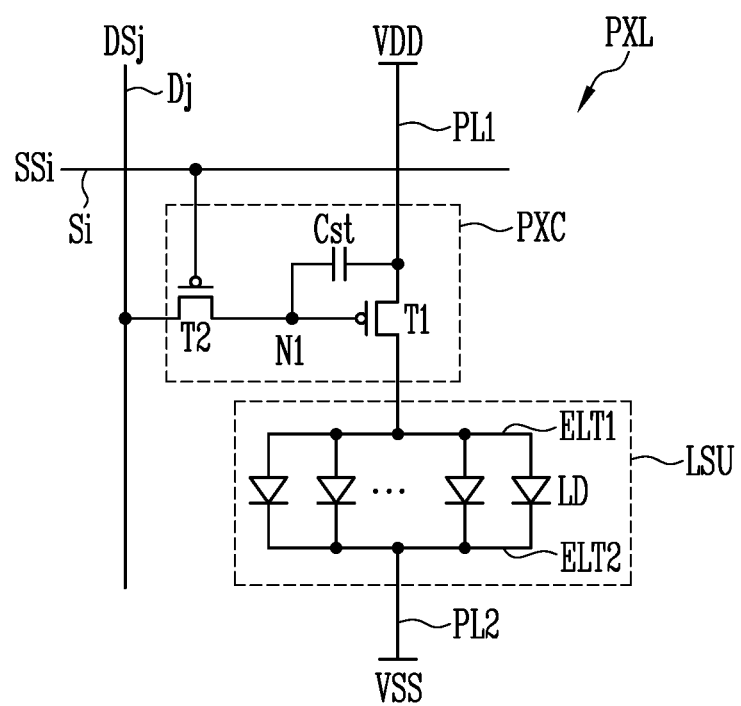
FIGS. 4 to 6 are circuit diagrams illustrating pixels according to one exemplary embodiment.
Figure 5:
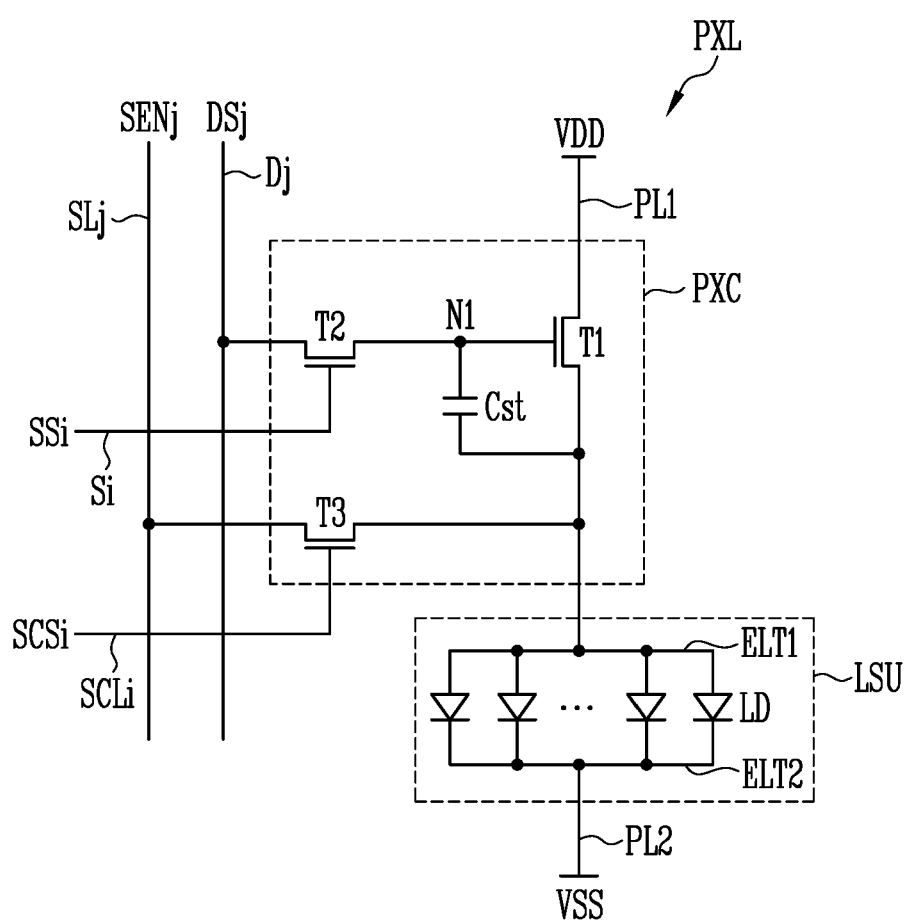
Figure 6:
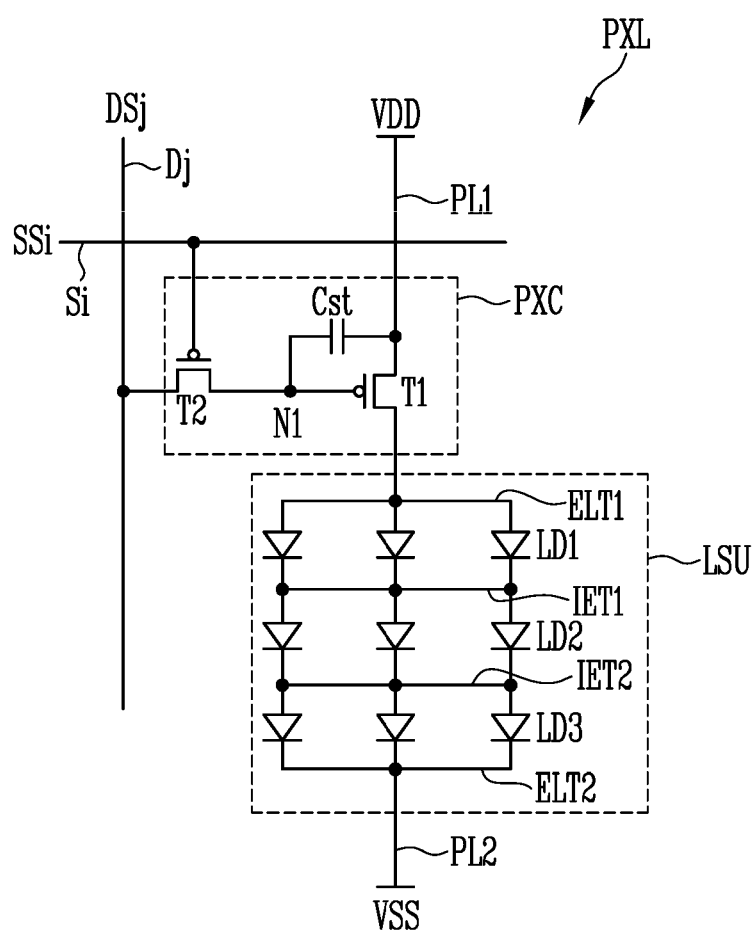

FIGS. 4 to 6 are circuit diagrams illustrating pixels according to one exemplary embodiment. For example, FIGS. 4 to 6 illustrates embodiments of pixels PXL that are applicable to an active display device. However, the types (or kinds) of the pixel PXL and the display device are not limited thereto.

According to exemplary embodiments, the pixels PXL illustrated in FIGS. 4 to 6 may be any one selected from the first pixel PXL1, the second pixel PXL2, and the third pixel PXL3 provided in the display panel PNL of FIG. 3. The first pixel PXL1, the second pixel PXL2, and the third pixel PXL3 may have substantially the same or similar structure.

Referring to FIG. 4, the pixel PXL may include a light source unit LSU for generating light at a luminance corresponding to a data signal and a pixel circuit PXC for driving the light source unit LSU.

The light source unit LSU may include one or more light-emitting elements LD coupled between a first power source VDD and a second power source VSS. For example, the light source unit LSU may include a first electrode ELT1 (or also referred to as "first pixel electrode" or "first alignment electrode") coupled to the first power source VDD through the pixel circuit PXC and a first power line PL1, a second electrode ELT2 (or also referred to as "second pixel electrode" or "second alignment electrode") coupled to the second power source VSS through a second power line PL2, and a plurality of light-emitting elements LD coupled in the same (e.g., substantially the same) direction between the first electrode EU and the second electrode EL2. In one exemplary embodiment, the first electrode ELT1 may be an anode, and the second electrode ELT2 may be a cathode.

Each of the light-emitting elements LD may include a first end (for example, a P-type end) coupled to the first power source VDD through the first electrode ELT1 and/or the pixel circuit PXC and a second end (for example, an N-type end) coupled to the second power source VSS through the second electrode ELT2. For example, the light-emitting elements LD may be coupled in parallel in a forward direction between the first electrode ELT1 and the second electrode ELT2. Each of the light-emitting elements LD coupled in the forward direction between the first power source VDD and the second power source VSS constitutes each effective light source, and the effective light sources may be collected to form the light source unit LSU of the pixel PXL.

The first power source VDD and the second power source VSS may have different potentials such that the light-emitting elements LD emit light. As an example, the first power source VDD may be set as a high potential power source, and the second power source VSS may be set as a low potential power source. In this case, a potential difference between the first power source VDD and the second power source VSS may be set to be greater than or equal to a threshold voltage of the light-emitting elements LD during an emission period of the pixel PXL.

One ends (for example, the P-type ends) of the light-emitting elements LD constituting each light source unit LSU may be commonly coupled to the pixel circuit PXC through one electrode of the light source unit LSU (for example, the first electrode ELT1 of each pixel PXL) and may be coupled to the first power source VDD through the pixel circuit PXC and the first power line PL1. The other ends (for example, the N-type ends) of the light-emitting elements LD may be commonly coupled to the second power source VSS through the other electrode of the light source unit LSU (for example, the second electrode ELT2 of each pixel PXL) and the second power line PL2.

The light-emitting elements LD may emit light at a luminance corresponding to a driving current supplied through a corresponding pixel circuit PXC. For example, during each frame period, the pixel circuit PXC may supply a driving current, which corresponds to a gradation value to be expressed in a corresponding frame, to the light source unit LSU. The driving current supplied to the light source unit LSU may be divided to flow to the light-emitting elements LD coupled in the forward direction. Accordingly, while each light-emitting element LD emits light at a luminance corresponding to a current flowing thereto, the light source unit LSU may emit light at a luminance corresponding to the driving current.

The pixel circuit PXC may be coupled between the first power source VDD and the first electrode ELT1. The pixel circuit PXC may be coupled to a scan line Si and a data line Dj of a corresponding pixel PXL. As an example, when the pixel PXL is in an $i^{th}$ horizontal line (row) and a $j^{th}$ vertical line (column) of the display area DA (wherein i is a natural number and j is a natural number), the pixel circuit PXC of the pixel PXL may be coupled to an $i^{th}$ scan line Si and a $j^{th}$ data line Dj in the display area DA.

According to exemplary embodiments, the pixel circuit PXC may include a plurality of transistors and at least one capacitor. For example, the pixel circuit PXC may include a first transistor T1, a second transistor T2, and a storage capacitor Cst.

The first transistor T1 is coupled between the first power source VDD and the light source unit LSU. For example, a first electrode (for example, a source electrode) of the first transistor T1 may be coupled to the first power source VDD, and a second electrode (for example, a drain electrode) of the first transistor T1 may be coupled to the first electrode ELT1. A gate electrode of the first transistor T1 is coupled to a first node N1. The first transistor T1 controls a driving current supplied to the light source unit LSU in response to a voltage of the first node N1. For example, the first transistor T1 may be a driving transistor which controls a driving current of the pixel PXL.

The second transistor T2 is coupled between the data line Dj and the first node N1. For example, a first electrode (for example, a source electrode) of the second transistor T2 may be coupled to the data line Dj, and a second electrode (for example, a drain electrode) of the second transistor T2 may be coupled to the first node N1. A gate electrode of the second transistor T2 is coupled to the scan line Si. When a scan signal SSi having a gate-on voltage (for example, a low voltage) is supplied from the scan line Si, the second transistor T2 is turned on to electrically couple the data line Dj and the first node N1.

During each frame period, a data signal DSj of a corresponding frame is supplied to the data line Dj, and the data signal DSj is transmitted to the first node N1 through the second transistor T2 turned on during a period in which the scan signal SSi having a gate-on voltage is supplied. For example, the second transistor T2 may be a switching transistor for transmitting each data signal DSj into the pixel PXL.

One electrode of the storage capacitor Cst is coupled to the first power source VDD, and the other electrode thereof is coupled to the first node N1. The storage capacitor Cst is charged with a voltage corresponding to the data signal DSj supplied to the first node N1 during each frame period.

In FIG. 4, the transistors included in the pixel circuit PXC, for example, all of the first and second transistors T1 and T2 are illustrated as being P-type transistors, but the present disclosure is not necessarily limited thereto. At least one selected from the first and second transistors T1 and T2 may be changed to an N-type transistor. In addition, the pixel circuit PXC may be provided with pixel circuits having various structures and/or driving methods.

Referring to FIG. 5, the pixel circuit PXC may be further coupled to a sensing control line SCLi and a sensing line SLj. As an example, the pixel circuit PXC of the pixel PXL in the $i^{th}$ horizontal line and the $j^{th}$ vertical line of the display area DA may be coupled to an $i^{th}$ sensing control line SCLi and a $j^{th}$ sensing line SLj of the display area DA. The pixel circuit PXC may further include a third transistor T3. In another exemplary embodiment, the sensing line SLj may be removed or omitted, and the characteristics of the pixel PXL may also be detected by detecting a sensing signal SENj through the data line Dj of the pixel PXL (or adjacent pixel).

The third transistor T3 is coupled between the first transistor T1 and the sensing line SLj. For example, one electrode of the third transistor T3 may be coupled to the first electrode (for example, the source electrode) of the first transistor T1 coupled to the first electrode ELT1, and the other electrode of the third transistor T3 may be coupled to the sensing line SLj. In some embodiments, when the sensing line SLj is removed or omitted, the other electrode of the third transistor T3 may be coupled to the data line Dj.

A gate electrode of the third transistor T3 is coupled to the sensing control line SCLi. When the sensing control line SCLi is removed or omitted, the gate electrode of the third transistor T3 may be coupled to the scan line Si. The third transistor T3 is turned on by a sensing control signal SCSi having a gate-on voltage (for example, a high level voltage) supplied to the sensing control line SCLi during a set or predetermined sensing period, thereby electrically coupling the sensing line The SLj and the first transistor T1.

According to exemplary embodiments, a sensing period may be a period in which the characteristics (for example, a threshold voltage of the first transistor T1) of each of the pixels PXL in the display area DA are extracted. During the above-described sensing period, a set or predetermined reference voltage, at which the first transistor T1 may be turned on, may be supplied to the first node N1 through the data line Dj and the second transistor T2, or each pixel PXL may be coupled to a current source and/or the like to turn the first transistor T1 on. In addition, the sensing control signal SCSi having a gate-on voltage may be supplied to the third transistor T3 to turn the third transistor T3 on, thereby coupling the first transistor T1 to the sensing line SLj. Thereafter, the sensing signal SENj is obtained through the sensing line SLj, and the characteristics of each pixel PXL, including the threshold voltage of the first transistor T1, may be detected using the sensing signal SENj. Characteristic information of each pixel PXL may be used to convert image data so that a characteristic difference between the pixels PXL in the display area DA may be compensated for.

In FIG. 5, all of the first to third transistors T1 to T3 are illustrated as being N-type transistors, but the present disclosure is not necessarily limited thereto. The present disclosure is not limited thereto. For example, at least one selected from the first to third transistors T1 to T3 may be changed to a P-type transistor.

In addition, in FIGS. 4 and 5, effective light sources constituting each light source unit LSU, that is, the light-emitting elements LD are all coupled in parallel, but the present disclosure is not necessarily limited thereto. For example, as illustrated in FIG. 6, the light source unit LSU of each pixel PXL may be formed to include a serial structure of at least two stages. In describing the exemplary embodiments of FIG. 6, detailed descriptions of components, which are the same as or similar to those of the exemplary embodiments of FIGS. 4 and 5 (for example, the pixel circuit PXC), will not be repeated.

Referring to FIG. 6, the light source unit LSU may include at least two light-emitting elements coupled in series with each other. As an example, the light source unit LSU may include a first light-emitting element LD1, a second light-emitting element LD2, and a third light-emitting element LD3 which are coupled in series between the first power source VDD and the second power source VSS. The first, second, and third light emitting elements LD1, LD2, and LD3 may constitute effective light sources.

Hereinafter, when a set or specific light-emitting element of the first, second, and third light-emitting elements LD1, LD2, and LD3 is described, the corresponding light-emitting element will be referred to as "first light-emitting element LD1, "second light-emitting element LD2," or "third light-emitting element LD3." When at least one light-emitting element of the first, second, and third light-emitting elements LD1, LD2, and LD3 is arbitrarily described, the light-emitting element will be referred to as "light-emitting element LD," or when the first, second, and third light-emitting elements LD1, LD2, and LD3 are collectively described, the first, second, and third light-emitting elements LD1, LD2, and LD3 will be referred to "light-emitting elements LD."

A first end (for example, a P-type end) of the first light-emitting element LD1 is coupled to the first power source VDD through the first electrode ELT1 (e.g., the first pixel electrode) of the light source unit LSU and/or the like. A second end (for example, an N-type end) of the first light-emitting element LD1 is coupled to a first end (for example, a P-type end) of the second light-emitting element LD2 through a first intermediate electrode IET1.

The first end of the second light-emitting element LD2 is coupled to the second end of the first light-emitting element LD1. A second end (for example, an N-type end) of the second light-emitting element LD2 is coupled to a first end (for example, a P-type end) of the third light-emitting element LD3 through a second intermediate electrode IET2.

The first end of the third light-emitting element LD3 is coupled to the second end of the second light-emitting element LD2. A second end (for example, an N-type end) of the third light-emitting element LD3 may be coupled to the second power source VSS through the second electrode ELT2 (e.g., the second pixel electrode) of the light source unit LSU and/or the like. In the above-described manner, the first, second, and third light-emitting elements LD1, LD2, and LD3 may be sequentially coupled in series between the first electrode ELT1 and the second electrode ELT2 of the light source unit LSU.

FIG. 6 illustrates the exemplary embodiment in which the light-emitting elements LD are coupled in a three-stage serial structure, but the present disclosure is not necessarily limited thereto. Two light-emitting elements LD may be coupled in a two-stage serial structure, or four or more light-emitting elements LD may also be coupled in a serial structure of four or more stages.

Assuming that the same luminance is expressed using the light-emitting elements LD under the same conditions (for example, the same size and/or number), in the light source unit LSU having a structure in which the light-emitting elements LD are coupled in series, a voltage applied between the first electrode ELT1 and the second electrode ELT2 may be increased, and a magnitude of a driving current flowing in the light source unit LSU may be reduced as compared with the light source unit LSU having a structure in which the light-emitting elements LD are coupled in parallel. Therefore, when the light source unit LSU of each pixel PXL is formed by applying a serial structure, a panel current flowing in the display panel PNL may be reduced.

As in the above-described exemplary embodiments, each light source unit LSU may include a plurality of light-emitting elements LD which are coupled in a forward direction between the first power source VDD and the second power source VSS to constitute effective light sources. In addition, the connection structure between the light-emitting elements LD may be variously changed according to exemplary embodiments. For example, the light-emitting elements LD may be coupled only in series or parallel or may be coupled in a serial-parallel mixed structure.

Figure 7:
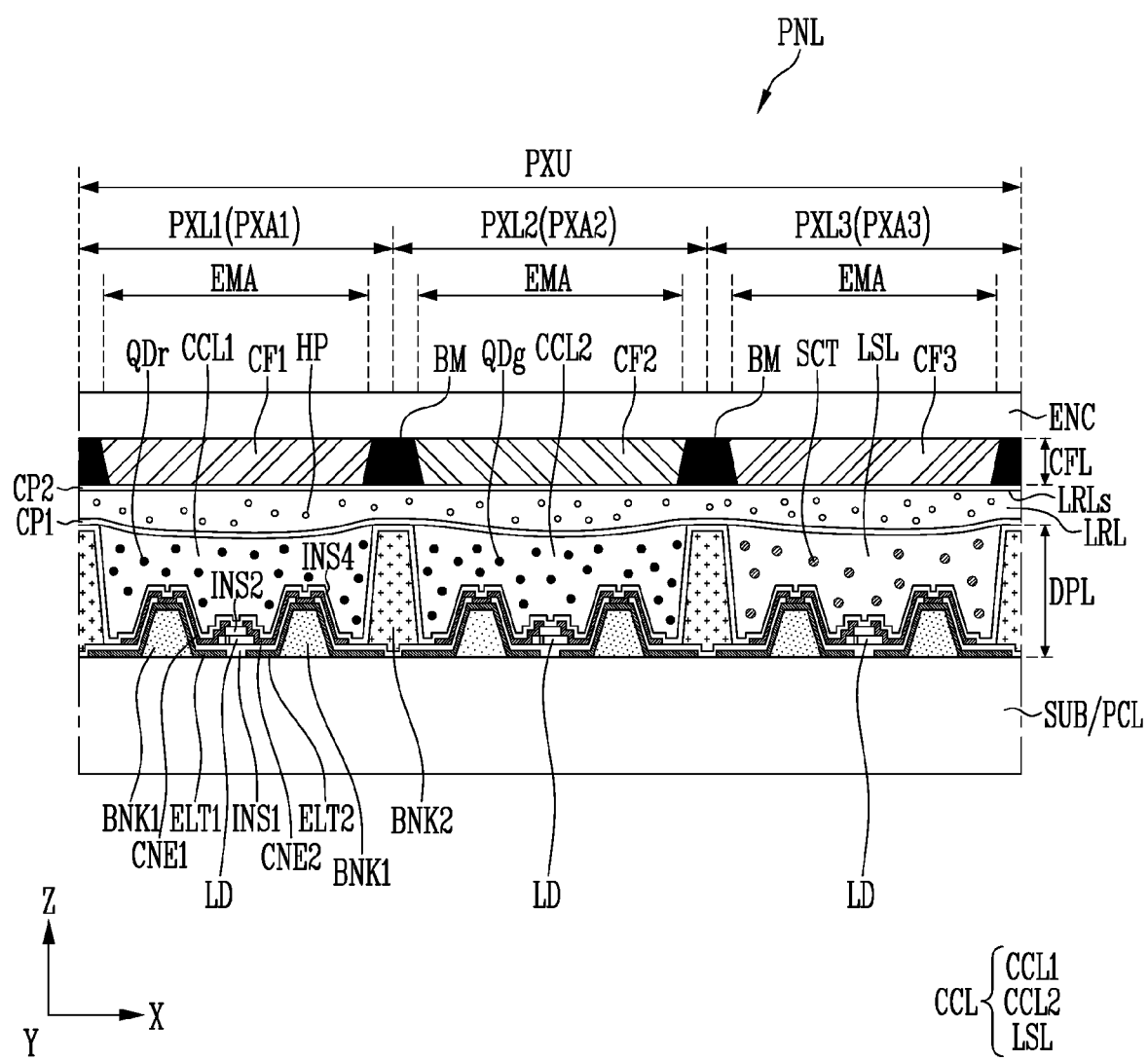
FIG. 7 is a cross-sectional view illustrating a display device according to one exemplary embodiment.
Figure 8:
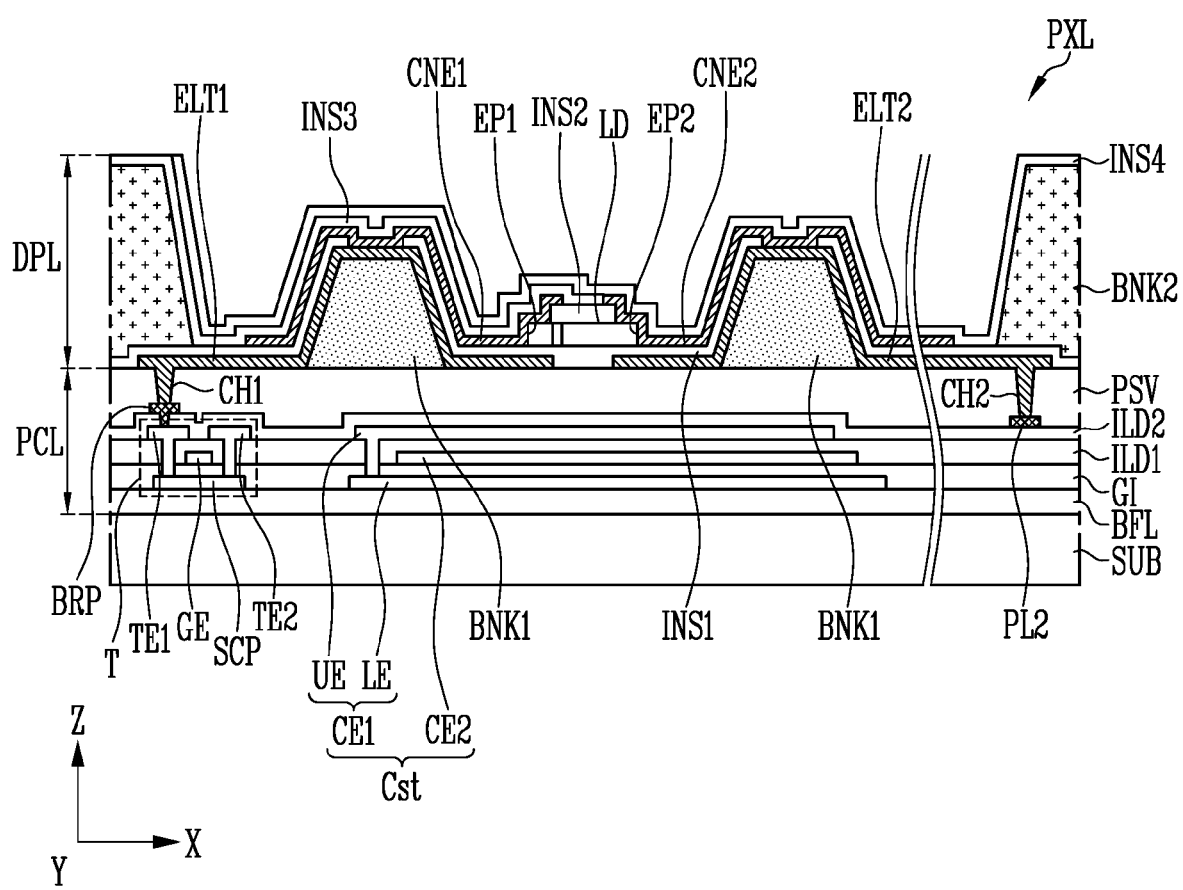
FIGS. 8 and 9 are cross-sectional views illustrating a pixel of FIG. 7.
Figure 9:
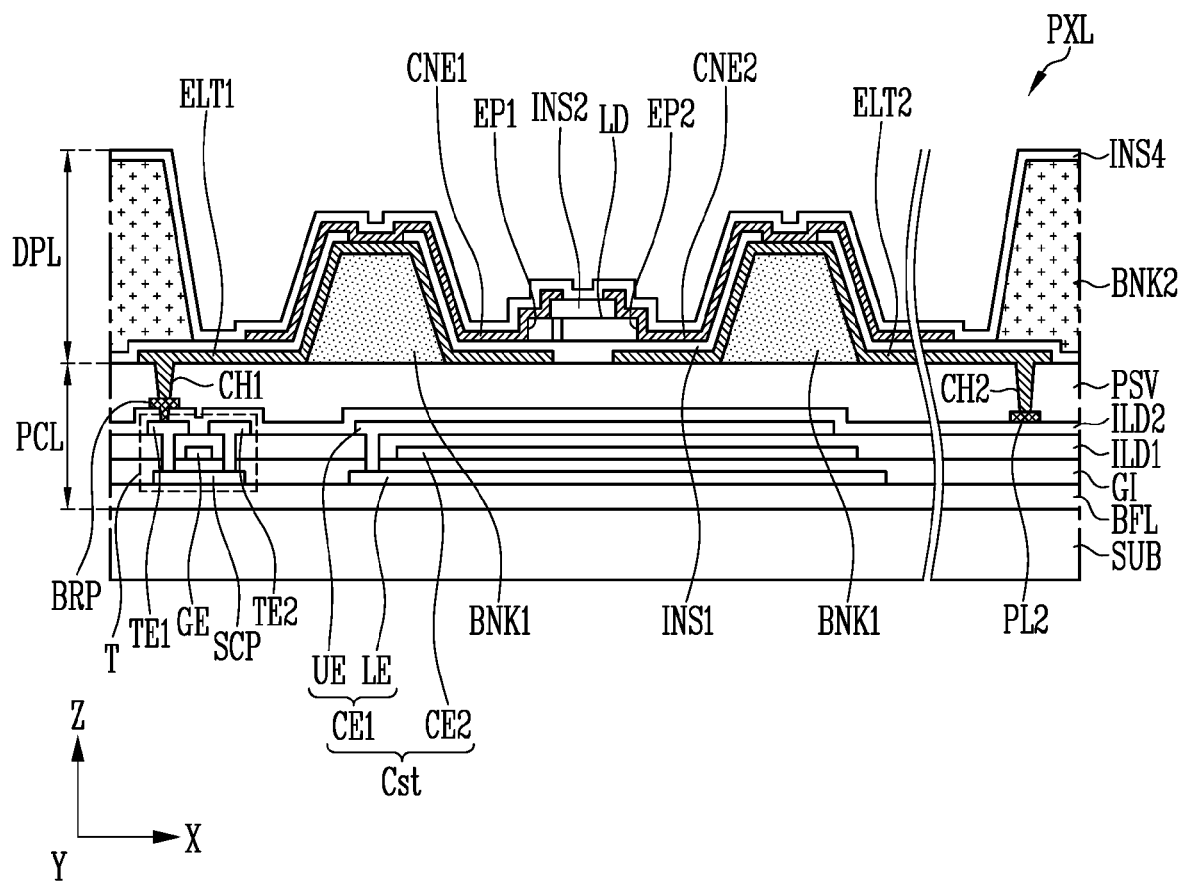

FIG. 7 is a cross-sectional view illustrating a display device according to one exemplary embodiment. FIGS. 8 and 9 are cross-sectional views illustrating a pixel of FIG. 7.

In FIG. 7, a cross section of the display device, for example, a cross section of a display panel PNL provided in the display device is illustrated based on an area in which one pixel unit PXU including a first pixel PXL1, a second pixel PXL2, and a third pixel PXL3 adjacent to each other is located.

In addition, FIGS. 8 and 9 schematically illustrate a structure of each pixel PXL based on one light-emitting element LD. In order to show various circuit elements constituting a pixel circuit PXC, transistors T (for example, the first transistor T1 of FIG. 4 or the like) and a storage capacitor Cst coupled to a first electrode ELT1 are illustrated. Hereinafter, when it is not necessary to distinguish and specify the first transistor T1, the first transistor T1 will also be collectively referred to as a "transistor T."

In some embodiments, the structures and/or positions on each layer of the transistors T and the storage capacitor Cst are not limited to the exemplary embodiments illustrated in FIGS. 8 and 9 and may be variously changed according to exemplary embodiments. In addition, in one exemplary embodiment, the transistors T constituting each pixel circuit PXC may have substantially the same or similar structure, but the present disclosure is not limited thereto. For example, in another exemplary embodiment, at least one of the transistors T constituting each pixel circuit PXC may have a different cross-sectional structure from the other transistors T and/or may be on a different layer from the other transistors T.

Referring to FIGS. 7 to 9, the pixel PXL and the display device including the same may include a substrate SUB, a circuit layer PCL on one surface of the substrate SUB, a display layer DPL, a color conversion layer CCL, a low refractive layer LRL, and/or a color filter layer CFL.

The circuit layer PCL may include circuit elements constituting the pixel circuit PXC of each pixel PXL and various lines coupled to the circuit elements. The display layer DPL may include electrodes (for example, first and second electrodes ELT1 and ELT2 and/or first and second contact electrodes CNE1 and CNE2) and the light-emitting elements LD which constitute a light source unit LSU of each pixel PXL.

The circuit layer PCL may include at least one circuit element electrically coupled to the light-emitting elements LD of each pixel PXL. For example, the circuit layer PCL may include a plurality of transistors T and the storage capacitor Cst which are in each pixel area PXA and constitute the pixel circuit PXC of a corresponding pixel PXL. In addition, the circuit layer PCL may further include at least one power line and/or signal line coupled to each pixel circuit PXC and/or light source unit LSU. For example, the circuit layer PCL may include a first power line PL1, a second power line PL2, and a scan line Si and a data line Dj of each pixel PXL. In some embodiments, when the pixel circuit PXC is removed or omitted and the light source unit LSU of each pixel PXL is directly coupled to the first and second power lines PL1 and PL2 (or set or predetermined signal lines), the circuit layer PCL may be removed or omitted.

In addition, the circuit layer PCL may include a plurality of insulating layers. For example, the circuit layer PCL may include a buffer layer BFL, a gate insulating layer GI, a first interlayer insulating layer ILD1, a second interlayer insulating layer ILD2, and/or a passivation layer PSV which are sequentially stacked on one surface of the substrate SUB. In addition, the circuit layer PCL may optionally further include at least one light blocking pattern and/or the like below at least some of the transistors T.

The buffer layer BFL may prevent or reduce diffusion of impurities into each circuit element. The buffer layer BFL may be formed as a single-layer but may also be formed as a multi-layer including at least two layers. When the buffer layer BFL is provided as the multi-layer, respective layers may be made of the same (e.g., substantially the same) material or may be made of different materials. Various circuit elements such as the transistors T and the storage capacitor Cst and various lines coupled to the circuit elements may be on the buffer layer BFL. In some embodiments, the buffer layer BFL may be removed or omitted according to exemplary embodiments. In this case, at least one circuit element and/or line may be directly on one surface of the substrate SUB.

Each transistor T includes a semiconductor pattern SCP (also referred to as "semiconductor layer" or "active layer"), a gate electrode GE, and first and second transistor electrodes TE1 and TE2. FIGS. 8 and 9 illustrate the exemplary embodiments in which each transistor T includes the first and second transistor electrodes TE1 and TE2 formed separately from the semiconductor pattern SCP, but the present disclosure is not necessarily limited thereto. For example, in another exemplary embodiment, the first and/or second transistor electrodes TE1 and TE2 provided in at least one transistor T may be integrated with each semiconductor pattern SCP.

The semiconductor pattern SCP may be on the buffer layer BFL. As an example, the semiconductor pattern SCP may be between the gate insulating layer GI and the substrate SUB on which the buffer layer BFL is formed. The semiconductor pattern SCP may include a first region in contact (e.g., physical contact) with each first transistor electrode TE1, a second region in contact (e.g., physical contact) with each second transistor electrode TE2, and a channel region positioned between the first region and the second region. According to exemplary embodiments, one selected from the first and second regions may be a source region, and the other thereof may be a drain region.

According to exemplary embodiments, the semiconductor pattern SCP may be a semiconductor pattern made of polysilicon, amorphous silicon, an oxide semiconductor, and/or the like. In addition, the channel region of the semiconductor pattern SCP may be a semiconductor pattern not doped with impurities, e.g., an intrinsic semiconductor, and the first and second regions of the semiconductor pattern SCP may each be a semiconductor pattern doped with set or predetermined impurities.

In one exemplary embodiment, the semiconductor patterns SCP of the transistors T constituting each pixel circuit PXC may be made of substantially the same or similar material. For example, the semiconductor patterns SCP of the transistors T may be made of the same (e.g., substantially the same) material selected from polysilicon, amorphous silicon, and an oxide semiconductor.

In another exemplary embodiment, some of the transistors T and the rest of the transistors T may include the semiconductor patterns SCP made of different materials. For example, the semiconductor patterns SCP of some of the transistors T may be made of polysilicon and/or amorphous silicon, and the semiconductor patterns SCP of the rest of the transistors T may be made of an oxide semiconductor.

The gate insulating layer GI may be on the semiconductor pattern SCP. As an example, the gate insulating layer GI may be between the semiconductor pattern SCP and the gate electrode GE. The gate insulating layer GI may be formed as a single-layer or a multi-layer and may include various types (or kinds) of organic/inorganic insulating materials including silicon nitride ($SiN_x$) and/or silicon oxide ($SiO_x$).

The gate electrode GE may be on the gate insulating layer GI. For example, the gate electrode GE may overlap the semiconductor pattern SCP with the gate insulating layer GI interposed therebetween. In FIGS. 8 and 9, the transistor T having a top-gate structure is illustrated, but in another exemplary embodiment, the transistor T may have a bottom-gate structure. In this case, the gate electrode GE may be under the semiconductor pattern SCP to overlap the semiconductor pattern SCP.

The first interlayer insulating layer ILD1 may be on the gate electrode GE. As an example, the first interlayer insulating layer ILD1 may be between the gate electrode GE and the first and second transistor electrodes TE1 and TE2. The first interlayer insulating layer ILD1 may be formed as a single-layer or a multi-layer and may include at least one inorganic insulating material and/or organic insulating material. For example, the first interlayer insulating layer ILD1 may include various types (or kinds) of organic/inorganic insulating materials including silicon nitride ($SiN_x$), silicon oxide ($SiO_x$), and/or silicon oxynitride ($SiO_xN_y$), and the structural material of the first interlayer insulating layer ILD1 is not particularly limited.

The first and second transistor electrodes TE1 and TE2 may be on each semiconductor pattern SCP with at least one first interlayer insulating layer ILD1 interposed therebetween. For example, the first and second transistor electrodes TE1 and TE2 may be on different ends of the semiconductor pattern SCP with the gate insulating layer GI and the first interlayer insulating layer ILD1 interposed therebetween. The first and second transistor electrodes TE1 and TE2 may be electrically coupled to each semiconductor pattern SCP. For example, the first and second transistor electrodes TE1 and TE2 may be coupled to the first and second regions of the semiconductor pattern SCP through respective contact holes passing through the gate insulating layer GI and the first interlayer insulating layer ILD1. According to exemplary embodiments, one selected from the first and second transistor electrodes TE1 and TE2 may be a source electrode, and the other thereof may be a drain electrode.

At least one transistor T provided in the pixel circuit PXC may be coupled to at least one pixel electrode. As an example, the transistor T may be electrically coupled to the first electrode ELT1 of a corresponding pixel PXL through a contact hole (for example, a first contact hole CH1) passing through the passivation layer PSV and/or a bridge pattern BRP.

The storage capacitor Cst includes a first capacitor electrode CE1 and a second capacitor electrode CE2 overlapping each other. Each of the first and second capacitor electrodes CE1 and CE2 may be formed as a single-layer or a multi-layer. In addition, at least one selected from the first and second capacitor electrodes CE1 and CE2 may be on the same layer as at least one electrode or the semiconductor pattern SCP that constitutes the first transistor T1.

For example, the first capacitor electrode CE1 may be formed as a multi-layered electrode including a lower electrode LE on the same layer as the semiconductor pattern SCP of the first transistor T1 and an upper electrode UE on the same layer as the first and second electrodes TE1 and TE2 of the first transistor T1 and electrically coupled to the lower electrode LE. The second capacitor electrode CE2 may be formed as a single-layered electrode on the same layer as the gate electrode of the first transistor T1 and between the lower electrode LE and the upper electrode UE of the first capacitor electrode CE1. However, the structure and/or position of each of the first and second capacitor electrodes CE1 and CE2 may be variously changed. For example, one selected from the first and second capacitor electrodes CE1 and CE2 may include a conductive pattern on a different layer from the electrodes (for example, the gate electrode GE and the first and second transistor electrodes TE1 and TE2) and the semiconductor pattern SCP which constitute the first transistor T1. As an example, the first capacitor electrode CE1 and/or the second capacitor electrode CE2 may have a single-layered or multi-layered structure including a conductive pattern on the second interlayer insulating layer ILD2.

In one exemplary embodiment, at least one signal line and/or power line coupled to each pixel PXL may be on the same layer as one electrode of the circuit elements constituting the pixel circuit PXC. As an example, the scan line Si of each pixel PXL may be on the same layer as the gate electrodes GE of the transistors T, and the data line Dj of each pixel PXL may be on the same layer as the first and second transistor electrodes TE1 and TE2 of the transistors T.

The first and/or second power lines PL1 and PL2 may be on the same layer as or a different layer from the gate electrodes GE or the first and second transistor electrodes TE1 and TE2 of the transistors T. As an example, the second power line PL2 for supplying a power of a second power source VSS may be on the second interlayer insulating layer ILD2, and thus, at least a portion thereof may be covered by the passivation layer PSV. The second power line PL2 may be electrically coupled to the second electrode ELT2 of the light source unit LSU, which is on the passivation layer PSV, through a second contact hole CH2 passing through the passivation layer PSV. However, the positions and/or structures of the first and/or second power lines PL1 and PL2 may be variously changed. For example, the second power line PL2 may be on the same layer as the gate electrodes GE or the first and second transistor electrodes TE1 and TE2 of the transistors T and thus be electrically coupled to the second electrode ELT2 through at least one bridge pattern and/or the second contact hole CH2.

The second interlayer insulating layer ILD2 may be on the first interlayer insulating layer ILD1 and may cover the first and second transistor electrodes TE1 and TE2 positioned on the first interlayer insulating layer ILD1 and/or the storage capacitor Cst. The second interlayer insulating layer ILD2 may be formed as a single-layer or a multi-layer and may include at least one inorganic insulating material and/or organic insulating material. For example, the second interlayer insulating layer ILD2 may include various types (or kinds) of organic/inorganic insulating materials including silicon nitride ($SiN_x$), silicon oxide ($SiO_x$), and/or silicon oxynitride ($SiO_xN_y$), but the present disclosure is not necessarily limited thereto.

The bridge pattern BRP for coupling at least one circuit element (for example, the first transistor T1) provided in the pixel circuit PXC to the first electrode ELT1, the first power line PL1, and/or the second power line PL2 may be on the second interlayer insulating layer ILD2. However, the second interlayer insulating layer ILD2 may be removed or omitted according to exemplary embodiments. In this case, the bridge pattern BRP and/or the like of FIGS. 8 and 9 may be removed or omitted, and the second power line PL2 may be on a layer in which one electrode of the transistor T is located.

The passivation layer PSV may be on the circuit elements such as the transistors T and the storage capacitor Cst and/or the lines such as the first and second power lines PL1 and PL2. The passivation layer PSV may be formed as a single-layer or a multi-layer and may include at least one inorganic insulating material and/or organic insulating material. As an example, the passivation layer PSV may include at least an organic insulating layer and may serve to substantially planarize a surface of the circuit layer PCL.

The display layer DPL may be on the passivation layer PSV of the circuit layer PCL. The display layer DPL may include at least one pair of the first electrode ELT1 and the second electrode ELT2 which are in an emission area EMA of each pixel PXL and constitute each light source unit LSU and one or more light-emitting elements LD which are coupled between the first electrode ELT1 and the second electrode ELT2. In FIGS. 7 to 9, one light-emitting element LD in each pixel PXL is illustrated, but as in the exemplary embodiments of FIG. 4 and/or the like, each pixel PXL may include a plurality of light-emitting elements LD coupled between the first electrode ELT1 and the second electrode ELT2. Accordingly, each exemplary embodiment will be described below assuming that the pixel PXL includes the plurality of light emitting elements LD.

In addition, the display layer DPL may further include the first and second contact electrodes CNE1 and CNE2 for more stably coupling the light-emitting elements LD between the first electrode ELT1 and the second electrode ELT2, a first bank BNK1 for making one region of each of the first and second electrodes ELT1 and ELT2 and/or the first and second contact electrodes CNE1 and CNE2 protrude upward, and a second bank BNK2 surrounding each emission area EMA. In addition, the display layer DPL may further include at least one conductive layer and/or insulating layer.

The first bank BNK1 may be on the circuit layer PCL. The first bank BNK1 may be formed as a separate-type or integral-type pattern. The first bank BNK1 may protrude in a height direction of the substrate SUB.

The first bank BNK1 may have various shapes according to exemplary embodiments. In an exemplary embodiment, the first bank BNK1 may be a bank structure having a positive taper structure. For example, as illustrated in FIGS. 7 to 9, the first bank BNK1 may be formed to have an inclined surface inclined at a set or predetermined angle with respect to the substrate SUB. However, the present disclosure is not necessarily limited thereto, and the first bank BNK1 may have a sidewall having a curved or stepped shape. As an example, the first bank BNK1 may have a cross section having a semicircle or semi-ellipse shape.

Electrodes and insulating layers on the first bank BNK1 may have a shape corresponding to the first bank BNK1. As an example, the first and second electrodes ELT1 and ELT2 and the first and second contact electrodes CNE1 and CNE2 may be on one region of the first bank BNK1 and may have an inclined surface or a curved surface having a shape corresponding to a shape of the first bank BNK1. Similarly, first, third, and/or fourth insulating layers INS1, INS3, and INS4 may be on the first bank BNK1 and may have an inclined surface or a curved surface having a shape corresponding to the shape of the first bank BNK1.

The first bank BNK1 may include an insulating material including at least one inorganic material and/or organic material. As an example, the first bank BNK1 may include at least one layer of an inorganic film including various inorganic insulating materials such as silicon nitride ($SiN_x$) and/or silicon oxide ($SiO_x$). In some embodiments, the first bank BNK1 may include at least one layer of an organic film and/or a photoresist film including various types (or kinds) of organic insulating materials and/or may include a single-layered or multi-layered insulator including a combination of organic and inorganic materials. For example, the structural material and/or pattern shape of the first bank BNK1 may be variously changed.

In an exemplary embodiment, the first bank BNK1 may serve as a reflective member. As an example, the first bank BNK1 may serve as a reflective member which improves light efficiency of the pixel PXL by guiding light emitted from each light-emitting element LD in a suitable or desired direction (upper direction of the pixel PXL) together with the first and second electrodes ELT1 and ELT2 provided thereon.

The first and second electrodes ELT1 and ELT2 constituting pixel electrodes of each pixel PXL may be on the first bank BNK1. The first electrode ELT1 and the second electrode ELT2 may be in each pixel area PXA in which each pixel PXL is provided and/or formed. For example, the first electrode ELT1 and the second electrode ELT2 may be in the emission area EMA of each pixel PXL. The first and second electrodes ELT1 and ELT2 may be spaced apart from each other. For example, the first and second electrodes ELT1 and ELT2 may be spaced apart from each other by a set or predetermined interval in each emission area EMA and may be side by side.

According to exemplary embodiments, the first and/or second electrodes ELT1 and ELT2 may have a pattern separated for each pixel PXL or may have a pattern commonly coupled to a plurality of pixels PXL. In some embodiments, before a process of forming the pixel PXL, for example, a process of aligning the light-emitting elements LD is completed, the first electrodes ELT1 of the pixels PXL in the display area DA may be coupled to each other, and the second electrodes ELT2 of the pixels PXL may be coupled to each other. For example, before the alignment of the light-emitting elements LD is completed, the first electrodes ELT1 of the pixels PXL may be formed integrally or non-integrally with each other and may be electrically coupled to each other, and the second electrodes ELT2 of the pixels PXL may be formed integrally or non-integrally with each other and may be electrically coupled to each other. When the first electrodes ELT1 or the second electrodes ELT2 of the pixels PXL are non-integrally coupled to each other, the first electrodes ELT1 or the second electrodes ELT2 may be electrically coupled to each other through at least one contact hole and/or bridge pattern.

The first and second electrodes ELT1 and ELT2 may each receive a first alignment signal (or first alignment voltage) and/or a second alignment signal (or second alignment voltage) in an alignment operation of the light-emitting elements LD. As an example, one selected from the first and second electrodes ELT1 and ELT2 may receive an alternating current (AC) alignment signal, and the other of the first and second electrodes ELT1 and ELT2 may receive an alignment voltage (for example, a ground voltage) having a constant voltage level. In some embodiments, in the alignment operation of the light-emitting elements LD, a set or predetermined alignment signal may be applied to the first and second electrodes ELT1 and ELT2. Accordingly, an electric field may be formed between the first electrode ELT1 and the second electrode ELT2. The light-emitting elements LD provided in each pixel area (for example, the emission area EMA of each pixel PXL) may be self-aligned between the first electrode ELT1 and the second electrode ELT2 by the electric field. After the alignment of the light-emitting elements LD is completed, at least the first electrodes ELT1 may be disconnected between the pixels PXL, and thus, the pixels PXL may be formed to be individually driven.

The first electrode ELT1 may be electrically coupled to a set or predetermined circuit element (for example, at least one transistor constituting the pixel circuit PXC), a power line (for example, the first power line PL1), and/or a signal line (for example, the scan line Si, the data line Dj, or a set or predetermined control line) through the first contact hole CH1. In one exemplary embodiment, the first electrode ELT1 may be electrically coupled to the bridge pattern BRP through the first contact hole CH1 and may be electrically coupled to the transistor T through the bridge pattern BRP. However, the present disclosure is not necessarily limited thereto, and the first electrode ELT1 may be directly coupled to a set or predetermined power line or signal line.

The second electrode ELT2 may be electrically coupled to a set or predetermined circuit element (for example, at least one transistor constituting the pixel circuit PXC), a power line (for example, the second power line PL2), and/or a signal line (for example, the scan line Si, the data line Dj, or a set or predetermined control line) through the second contact hole CH2. In one exemplary embodiment, the second electrode ELT2 may be electrically coupled to the second power line PL2 through the second contact hole CH2. However, the present disclosure is not necessarily limited thereto, and the second electrode ELT2 may be directly coupled to a set or predetermined power line or signal line.

Each of the first and second electrodes ELT1 and ELT2 may include at least one conductive material (e.g., electrically conductive material). As an example, each of the first and second electrodes ELT1 and ELT2 may include at least one metal selected from various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and copper (Cu), or an ally including the at least one metal, or may include at least one conductive material (e.g., electrically conductive material) selected from a conductive oxide such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (ZTO), and/or fluorine tin oxide (FTO), and a conductive polymer such as poly(3,4-ethylenedioxythiophene) (PEDOT), but the present disclosure is not limited thereto. For example, each of the first and second electrodes ELT1 and ELT2 may include other conductive materials (e.g., electrically conductive materials) such as carbon nanotubes and/or graphene. In addition, each of the first and second electrodes ELT1 and ELT2 may be formed as a single-layer or multi-layer. As an example, each of the first and second electrodes ELT1 and ELT2 may include a reflective electrode layer including a reflective conductive material (e.g., a reflective, electrically conductive material). In addition, each of the first and second electrodes ELT1 and ELT2 may optionally further include at least one transparent electrode layer on and/or below the reflective electrode layer and at least one conductive capping layer covering an upper portion of the reflective electrode layer and/or the transparent electrode layer.

The first insulating layer INS1 may be on one region of each of the first and second electrodes ELT1 and ELT2. For example, the first insulating layer INS1 may be formed to cover one region of each of the first and second electrodes ELT1 and ELT2 and may include an opening exposing the other region of each of the first and second electrodes ELT1 and ELT2. As an example, the first insulating layer INS1 may include an opening formed on an upper surface of the first bank BNK1. The first and second electrodes ELT1 and ELT2 may be electrically coupled to the first and second contact electrodes CNE1 and CNE2, respectively, in regions in which the first insulating layer INS1 is opened. In some embodiments, the first insulating layer INS1 may be removed or omitted according to exemplary embodiments. In this case, the light-emitting elements LD may be directly on the passivation layer PSV and/or one ends of the first and second electrodes ELT1 and ELT2.

In one exemplary embodiment, the first insulating layer INS1 may be formed to primarily and entirely cover the first and second electrodes ELT1 and ELT2. After the light-emitting elements LD are provided and aligned on the first insulating layer INS1, the first insulating layer INS1 may be partially opened to expose one regions of the first and second electrodes ELT1 and ELT2. For example, the first insulating layer INS1 may have the openings, which expose one regions of the first and second electrodes ELT1 and ELT2, on the upper surface of the first bank BNK1, and may cover at least portions of inclined surfaces and/or curved surfaces of the first and second electrode ELT1 and ELT2. In another exemplary embodiment, after the provision and alignment of the light-emitting elements LD are completed, the first insulating layer INS1 may be patterned in the form of an individual pattern that is locally only below the light-emitting elements LD. After the first and second electrodes ELT1 and ELT2 are formed, the first insulating layer INS1 may be formed to cover the first and second electrodes ELT1 and ELT2. Accordingly, it is possible to prevent or reduce damage to the first and second electrodes ELT1 and ELT2 in a subsequent process.

The first interlayer insulating layer ILD1 may be formed as a single-layer or a multi-layer and may include at least one inorganic insulating material and/or organic insulating material. For example, the first insulating layer INS1 may include various types (or kinds) of organic/inorganic insulating materials including silicon nitride ($SiN_x$), silicon oxide ($SiO_x$), and/or aluminum oxide ($AlO_x$).

The light-emitting elements LD may be provided and aligned on the first and second electrodes ELT1 and ELT2 and the first insulating layer INS1. In some embodiments, before the light-emitting elements LD are provided, the second bank BNK2 may be formed around the emission area EMA. For example, the second bank BNK2 may be formed in the display area DA to surround each emission area EMA.

The second bank BNK2 may be a structure defining the emission area EMA of each pixel PXL and may be, for example, a pixel definition layer. For example, the second bank BNK2 may be in a boundary region of each pixel area PXA in which each pixel PXL is provided and/or in a region between adjacent pixels PXL so as to surround the emission area EMA of each pixel area PXA. Hereinafter, when a pixel area of first, second, and third pixel areas PXA1, PXA2, and PXA3 is arbitrarily described, the pixel area will be referred to as "pixel area," or when at least two pixel areas thereof are collectively described, the pixel areas will be referred to as "pixel areas PXA."

The second bank BNK2 may include at least one light blocking and/or reflective material to prevent or reduce light leakage between adjacent pixels PXL. For example, the second bank BNK2 may include at least one black matrix material (for example, at least one suitable light blocking material generally used in the art) selected from various types (or kinds) of black matrix materials, and/or a color filter material having a set or specific color. For example, the second bank BNK2 may be formed as a black opaque pattern to block or reduce light transmission. In one exemplary embodiment, a reflective layer may be formed on a surface (for example, a sidewall) of the second bank BNK2 so as to further increase light efficiency of the pixel PXL.

In addition, in an operation of providing the light-emitting elements LD to each pixel PXL, the second bank BNK2 may serve as a dam structure defining each emission area EMA to which the light-emitting elements LD should be supplied. For example, because each emission area EMA is partitioned by the second bank BNK2, a desired type (or kind) and/or amount of light-emitting element ink may be supplied to the emission area EMA.

In one exemplary embodiment, the second bank BNK2 may be concurrently (e.g., simultaneously) formed on the same layer as the first banks BNK1 in a process of forming the first banks BNK1 of the pixels PXL. In another exemplary embodiment, the second bank BNK2 may be formed on the same layer as or a different layer from the first banks BNK1 through a process separate from the process of forming the first banks BNK1. As an example, the second bank BNK2 may be formed on the first bank BNK1. For example, the second bank BNK2 may be formed on the first insulating layer INS1, but the present disclosure is not limited thereto.

The light-emitting elements LD may be provided to each pixel area PXA in which the first bank BNK1, the first and second electrodes ELT1 and ELT2, the first insulating layer INS1, and the second bank BNK2 are formed and may be aligned between the first electrode ELT1 and the second electrode ELT2. As an example, the plurality of light-emitting elements LD may be provided to the emission area EMA of each pixel PXL through an inkjet method, a slit coating method, and/or various other methods. The light-emitting elements LD may be aligned to have directionality between the first electrode ELT1 and the second electrode ELT2 by a set or predetermined alignment signal (or alignment voltage) applied to each of the second electrodes ELT1 and ELT2.

In one exemplary embodiment, at least some of the light-emitting elements LD may be between a pair of first and second electrodes ELT1 and ELT2 so as to overlap the pair of the first and second electrodes ELT1 of which both ends (e.g., the first and second ends EP1 and EP2) are adjacent to each other. In another exemplary embodiment, at least some of the light-emitting elements LD may be between a pair of adjacent first and second electrodes ELT1 and ELT2 so as to not overlap the first and/or second electrodes ELT1 and ELT2 and may be electrically coupled to the pair of first and second electrodes ELT1 and ELT2 through the first and second contact electrodes CNE1 and CNE2. Each light-emitting element LD electrically coupled between the first electrode ELT1 and the second electrode ELT2 may constitute an effective light source of a corresponding pixel PXL. The effective light sources may constitute the light source unit LSU of the corresponding pixel PXL.

A second insulating layer INS2 may be on one regions of the light-emitting elements LD. For example, the second insulating layer INS2 may be on one region of each of the light-emitting elements LD so as to expose the first and second ends EP1 and EP2 of each of the light-emitting elements LD. As an example, the second insulating layer INS2 may be locally on one region including a central region of each of the light-emitting elements LD. When the second insulating layer INS2 is formed on the light-emitting elements LD after the alignment of the light-emitting elements LD is completed, it is possible to prevent or reduce separation of the light-emitting elements LD from the aligned position thereof.

The second insulating layer INS2 may be formed as an independent pattern in the emission area EMA of each pixel PXL, but the present disclosure is not limited thereto. The second insulating layer INS2 may be removed or omitted according to exemplary embodiments, and in this case, one end of each of the first and second contact electrodes CNE1 and CNE2 may be directly positioned on (e.g., physically contacting) upper surfaces of the light-emitting elements LD.

The second insulating layer INS2 may be formed as a single-layer or a multi-layer and may include at least one inorganic insulating material and/or organic insulating material. For example, the second insulating layer INS2 may include various types (or kinds) of organic/inorganic insulating materials including silicon nitride ($SiN_x$), silicon oxide ($SiO_x$), aluminum oxide ($AlO_x$), and/or a photoresist (PR) material.

Both ends of the light-emitting elements LD not covered by the second insulating layer INS2, that is, the first and second ends EP1 and EP2, may be respectively covered by the first and second contact electrodes CNE1 and CNE2. The first and second contact electrodes CNE1 and CNE2 are formed to be spaced apart from each other. For example, the first and second contact electrodes CNE1 and CNE2 adjacent to each other may be spaced apart from each other on the first and second ends EP1 and EP2 of at least one adjacent light-emitting element LD with the second insulating layer INS2 interposed therebetween.

In addition, the first and second contact electrodes CNE1 and CNE2 may be on the first and second electrodes ELT1 and ELT2 so as to cover exposed regions of the first and second electrodes ELT1 and ELT2. For example, the first and second contact electrodes CNE1 and CNE2 may be on one region of each of the first and second electrodes ELT1 and ELT2 so as to be respectively in direct or indirect contact with the first and second electrodes ELT1 and ELT2 on or around first banks BNK1. Accordingly, the first and second contact electrodes CNE1 and CNE2 may be electrically coupled to the first and second electrodes ELT1 and ELT2, respectively. For example, the first and second electrodes ELT1 and ELT2 may be electrically coupled to the first and second ends EP1 and EP2 of at least one adjacent light-emitting element LD through the first and second contact electrodes CNE1 and CNE2, respectively.

In one exemplary embodiment, as illustrated in FIG. 8, the first and second contact electrodes CNE1 and CNE2 may be sequentially formed on different layers on one surface of the substrate SUB. In this case, the third insulating layer INS3 may be between the first contact electrode CNE1 and the second contact electrode CNE2. In some embodiments, the order of forming the first and second contact electrodes CNE1 and CNE2 may be changed. For example, in another exemplary embodiment, before the first contact electrode CNE1 is formed, the second contact electrode CNE2 may be formed first, and after the third insulating layer INS3 is formed to cover the second contact electrode CNE2 and the second insulating layer INS2, the first contact electrode CNE1 may be formed on one end of the third insulating layer INS3. However, the present disclosure is not necessarily limited thereto, and as illustrated in FIG. 9, the first and second contact electrodes CNE1 and CNE2 may be on the same layer. For example, the first and second contact electrodes CNE1 and CNE2 may be formed as the same conductive layer on one surface of the substrate SUB. In this case, because the first and second contact electrodes CNE1 and CNE2 may be formed at the same (e.g., substantially the same) time in the same (e.g., substantially the same) process, a manufacturing process of the pixel PXL and the display device including the same may be simplified. However, the present disclosure is not necessarily limited thereto, and the first and second contact electrodes CNE1 and CNE2 may be sequentially formed.

The first and second contact electrodes CNE1 and CNE2 may be made of various transparent conductive materials. As an example, the first and second contact electrodes CNE1 and CNE2 may include at least one selected from various transparent conductive materials (e.g., transparent, electrically conductive materials) such as indium tin oxide (ITO), indium zinc oxide (IZO), indium tin zinc oxide (ITZO), zinc oxide (ZnO), aluminum zinc oxide (AZO), gallium zinc oxide (GZO), zinc tin oxide (ZTO), gallium tin oxide (ZTO), and/or fluorine tin oxide (FTO) and may be substantially transparent or semi-transparent to satisfy suitable or desired transmittance. Accordingly, light emitted from the light-emitting elements LD through the first and second ends EP1 and EP2 thereof may pass through the first and second contact electrodes CNE1 and CNE2 to be emitted to the outside of the display panel PNL.

The third insulating layer INS3 may be on the first contact electrode CNE1 so as to cover the first contact electrode CNE1. For example, the third insulating layer INS3 may be on the second insulating layer INS2 and the first contact electrode CNE1 such that one end of the third insulating layer INS3 is interposed between the first contact electrode CNE1 and the second contact electrode CNE2. One end of the second contact electrode CNE2 may be on one end of the third insulating layer INS3.

As described above, when the second and third insulating layers INS2 and INS3 are formed on the light-emitting elements LD, electrical stability can be secured between the first end EP1 and the second end EP2 of the light-emitting elements LD. For example, the first and second contact electrodes CNE1 and CNE2 may be stably separated by the second and third insulating layers INS2 and INS3. Accordingly, it is possible to effectively prevent or reduce occurrence of short defects between the first end EP1 and the second end EP2 of the light-emitting elements LD.

The third insulating layer INS3 may be formed as a single-layer or a multi-layer and may include at least one inorganic insulating material and/or organic insulating material. For example, the third insulating layer INS3 may include various types (or kinds) of organic/inorganic insulating materials including silicon nitride ($SiN_x$), silicon oxide ($SiO_x$), aluminum oxide ($AlO_x$), and/or a PR material.

The fourth insulating layer INS4 may be on the first and second contact electrodes CNE1 and CNE2 and/or the third insulating layer INS3. For example, the fourth insulating layer INS4 may cover the first and second banks BNK1 and BNK2, the first and second electrodes ELT1 and ELT2, and the first, second, and/or third insulating layers INS1, INS2, and/or INS3, the light-emitting elements LD, and the first and second contact electrodes CNE1 and CNE2. The fourth insulating layer INS4 may include at least one layer of an inorganic film and/or organic film.

The fourth insulating layer INS4 may be formed as a single-layer or a multi-layer and may include at least one inorganic insulating material and/or organic insulating material. For example, the fourth insulating layer INS4 may include various types (or kinds) of organic/inorganic insulating materials including silicon nitride ($SiN_x$), silicon oxide ($SiO_x$), and/or aluminum oxide ($AlO_x$).

In one exemplary embodiment, the fourth insulating layer INS4 may include a thin film encapsulation layer having a multi-layered structure. For example, the fourth insulating layer INS4 may include a thin film encapsulation layer having a multi-layered structure, which includes at least two inorganic insulating layers and at least one organic insulating layer interposed between the at least two inorganic insulating layers. However, the present disclosure is not necessarily limited thereto, and the structural material and/or structure of the fourth insulating layer INS4 may be variously changed.

The color conversion layer CCL may be on the display layer DPL. The color conversion layer CCL may be in a region partitioned by the second bank BNK2.

The color conversion layer CCL may include a first color conversion layer CCL1 on the first pixel PXL1, a second color conversion layer CCL2 on the second pixel PXL2, and a light scattering layer LSL on the third pixel PXL3.

In one exemplary embodiment, the first to third pixels PXL1, PXL2, and PXL3 may include the light-emitting elements LD that emit light having the same (e.g., substantially the same) color. For example, the first to third pixels PXL1, PXL2, and PXL3 may include the light-emitting elements LD that emit third color light, for example, color light in a wavelength band in a range of about 400 nm to about 500 nm. The color conversion layer CCL including color-converting particles is on at least some pixels PXL of the first to third pixels PXL1, PXL2, and PXL3, thereby displaying a full-color image. However, the present disclosure is not necessarily limited thereto, and the first to third pixels PXL1, PXL2, and PXL3 may include the light-emitting elements LD that emit light having different colors. For example, the first pixel PXL1 may include a first color (e.g., red) light-emitting element LD, and the second pixel PXL2 may include a second color (e.g., green) light-emitting element LD, and the third pixel PXL3 may include a third color (e.g., blue) light-emitting element LD.

The first color conversion layer CCL1 may include first color-converting particles that convert a third color light emitted from the light-emitting element LD into first color light. For example, when the light-emitting element LD is a blue light-emitting element that emits blue light and the first pixel PXL1 is a red pixel, the first color conversion layer CCL1 may include first quantum dots QDr that convert the blue light emitted from the blue light-emitting element into red light. For example, the first color conversion layer CCL1 may include a plurality of first quantum dots QDr dispersed in a set or predetermined matrix material such as a base resin. The first quantum dots QDr may absorb blue light and shift a wavelength according to an energy transition to emit red light in a wavelength band in a range of about 620 nm to about 780 nm. In some embodiments, when the first pixel PXL1 is a different color pixel, the first color conversion layer CCL1 may include first quantum dots corresponding to a color of the first pixel PXL1.

The second color conversion layer CCL2 may include second color-converting particles that convert the third color light emitted from the light-emitting element LD into a second color light. As an example, when the light-emitting element LD is a blue light-emitting element that emits blue light and the second pixel PXL2 is a green pixel, the second color conversion layer CCL2 may include second quantum dots QDg that convert the blue light emitted from the blue light-emitting element into green light. For example, the second color conversion layer CCL2 may include a plurality of second quantum dots QDg dispersed in a set or predetermined matrix material such as a base resin. The second quantum dots QDr may absorb blue light and shift a wavelength according to an energy transition to emit green light in a wavelength band in a range of about 500 nm to about 570 nm. In some embodiments, when the second pixel PXL2 is a different color pixel, the second color conversion layer CCL2 may include second quantum dots corresponding to a color of the second pixel PXL2.

Each of the first quantum dot QDr and the second quantum dot QDg may be selected from Group II-IV compounds, Group IV-VI compounds, Group IV elements, Group VI compounds, and combinations thereof, but the present disclosure is not limited thereto.

The first quantum dot QDr and the second quantum dot QDg may have a full width of half maximum (FWHM) of an emission wavelength spectrum of about 45 nm or less, and light emitted through the first quantum dot QDr and the second quantum dot QDg may be emitted in all directions (e.g., in substantially every direction). Accordingly, a viewing angle of a display device may be improved.

In some embodiments, the first quantum dots (QDr) and the second quantum dots QDg may have a shape of spherical, pyramidal, multi-arm, and/or cubic nanoparticles, nanotubes, nanowires, nanofibers, and/or nanoplate particles, but the present disclosure is not necessarily limited thereto. The shape of the first quantum dots QDr and the second quantum dots QDg may be variously changed.

In one exemplary embodiment, when blue light having a relatively short wavelength in a visible light region is incident on each of the first quantum dots QDr and the second quantum dots QDg, it is possible to increase an absorption coefficient of the first quantum dots QDr and the second quantum dots QDg. Accordingly, efficiency of light emitted from the first and second pixels PXL1 and PXL2 can be finally increased, and excellent color reproducibility can also be secured. In addition, when the light source unit LSU of the first color, the second color, and third pixels PXL1, PXL2, and PXL3 is formed using the same (e.g., substantially the same) color light-emitting elements LD (for example, the blue light emitting elements LD), it is possible to increase manufacturing efficiency of a display device.

The light scattering layer LSL may be optionally provided in order to efficiently use the third color light emitted from the light-emitting element LD. As an example, when the light-emitting element LD is a blue light-emitting element emitting blue light and the third pixel PXL3 is a blue pixel, the light scattering layer LSL may include at least one type (or kind) of light scattering particles SCT so as to efficiently use light emitted from the light-emitting element LD.

For example, the light scattering layer LSL may include a plurality of light scattering particles SCT dispersed in a set or predetermined matrix material such as a base resin. As an example, the light scattering layer LSL may include light scattering particles SCT of titanium dioxide ($TiO_2$) and/or silica, but the structural material of the light scattering particles SCT is not limited thereto. In some embodiments, the light scattering particles SCT do not have to be only in the third pixel area PXA3 in which the third pixel PXL3 is formed. As an example, the light scattering particles SCT may be optionally included in the first and/or second color conversion layers CCL1 and CCL2.

The low refractive layer LRL may be on the color conversion layer CCL. The low refractive layer LRL may be over the first to third pixels PXL1, PXL2, and PXL3. The low refractive layer LRL may have a relatively low refractive index as compared with the color conversion layer CCL. For example, a difference between a refractive index of the low refractive layer LRL and a refractive index of the color conversion layer CCL may be 0.3 or more but is not limited thereto.

In some embodiments, in a process of forming the color conversion layer CCL described above, a thickness distribution of the color conversion layer CCL may be increased due to a difference in polarity between the second bank BNK2 and ink of the color conversion layer CCL. When a stepped difference is formed due to the color conversion layer CCL and/or the like, display quality such as a color difference may be degraded due to a difference in volume of the color filter layer CFL thereon, which will be further described below. Accordingly, in the display device according to one exemplary embodiment, spreadability of the low refractive layer LRL can be secured to minimize or reduce a step difference due to the color conversion layer CCL and/or the like.

In some embodiments, the low refractive layer LRL may include a monomer represented by Formula 1 below.

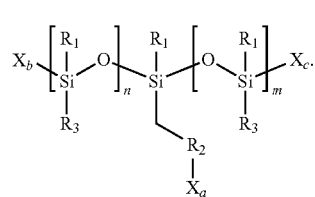

Formula 1

In Formula 1, $R_1$ and $R_3$ may each independently be a substituted or unsubstituted alkyl group or hydrogen, $R_2$ may be a substituted or unsubstituted alkyl group having two or more carbon atoms, $X_a$, $X_b$, and $X_c$ may each independently be a curable functional group, and n and m may each independently be a natural number in a range of 1 to 5. In one exemplary embodiment, the curable functional group may include at least one selected from a methacrylate group, an acrylate group, a vinyl group, and an epoxy group, but the present disclosure is not necessarily limited thereto.

When the low refractive layer LRL includes the monomer represented by Formula 1, silicon (Si) atoms with low surface tension may be linearly arranged to improve spreadability on a surface thereof and may concurrently secure compatibility with a matrix material such as a resin due to a T-shaped branch. The monomer may be included in a content (e.g., amount or weight) in a range of 3 wt % to 10% wt % with respect to 100 wt % of a solid content of the low refractive layer LRL. When the monomer is included in a content (e.g., amount or weight) less than 3 wt %, an effect of decreasing a step difference due to the low refractive layer LRL may be insignificant. In addition, when the monomer is included in a content (e.g., amount or weight) exceeding 10 wt %, a hardness of the low refractive layer LRL and adhesion with a member thereunder are likely to be lowered.

Hereinafter, effects of decreasing a step difference for Comparative Example and Examples will be described with reference to Table 1. Comparative Example corresponds to a case in which the low refractive layer LRL does not include the monomer, and Examples 1 to 4 correspond to cases in which the low refractive layer LRL includes the monomer. In this case, Example 1 corresponds to a case in which the monomer may be included in a content (e.g., amount or weight) of 1 wt % with respect to 100 wt % of a solid content of the low refractive layer LRL. Example 2 corresponds to a case in which the monomer may be included in a content (e.g., amount or weight) of 3 wt % with respect to 100 wt % of a solid content of the low refractive layer LRL. Example 3 corresponds to a case in which the monomer may be included in a content (e.g., amount or weight) of 5 wt % with respect to 100 wt % of a solid content of the low refractive layer LRL. Example 4 corresponds to a case in which the monomer may be included in a content (e.g., amount or weight) of 7 wt % with respect to 100 wt % of a solid content of the low refractive layer LRL.

TABLE 1

| | Monomer content (wt %) | Step difference (μm) | Effect of decreasing step difference (%) |
|---|---|---|---|
| Comparative Example | 0 | 2.604 | — |
| Example 1 | 1 | 2.218 | 14.8 |
| Example 2 | 3 | 0.950 | 63.5 |
| Example 3 | 5 | 0.672 | 74.2 |
| Example 4 | 7 | 0.626 | 76.0 |

A step difference was measured based on an upper surface LRLs of the low refractive layer LRL. The expression "upper surface LRLs of the low refractive layer LRL," as used herein, may mean a surface opposite to one surface covering the color conversion layer CCL. In some embodiments, heights in a third direction (Z-axis direction) from the substrate SUB to the upper surface LRLs of the low refractive layer LRL were compared with each other to measure the step difference.

It can be seen in Table 1 that the step difference of the low refractive layer LRL of Example 1 was 2.218 μm, which was improved by about 14.8% as compared with Comparative Example, the step difference of Example 2 was 2.218 μm, which was improved by about 63.5% as compared with Comparative Example, and the step difference of Example 3 was 0.950 μm, which was improved by about 74.2%, and the step difference in Example 4 was 0.626 um, which was improved by about 76.0%. For example, according to Examples 2 to 4, when the low refractive layer LRL includes a set or predetermined content (e.g., amount or weight) of the monomer, it is possible to secure spreadability of the low refractive layer LRL to decrease the step difference thereunder.

According to exemplary embodiments, the low refractive layer LRL may include a base resin and hollow particles HP dispersed in the base resin. The Hollow particles HP may include hollow silica particles. According to exemplary embodiments, the hollow particles HP may include at least one selected from acrylic, polyimide, urethane, styrene, siloxane, and epoxy on surfaces thereof. In addition, the low refractive layer LRL may include at least one selected from zinc oxide (ZnO) particles, titanium dioxide ($TiO_2$) particles, nano silicate particles, and porogen particles, but the present disclosure is not necessarily limited thereto.

In one exemplary embodiment, the hollow particles HP may be included in a content (e.g., amount or weight) in a range of 10 wt % to 80 wt % with respect to 100 wt % of a solid content of the low refractive layer LRL. The hollow particles HP may have a diameter in a range of 10 nm to 200 nm, and a shell of the hollow particles (HP) may have a thickness in a range of 5 nm to 50 nm, but the present disclosure is not necessarily limited thereto. The low refractive layer LRL may further include at least one selected from a curing agent, a photopolymerization initiator, and an ultraviolet absorber according to exemplary embodiments.

As described above, when the low refractive layer LRL includes a set or predetermined content (e.g., amount or weight) of the monomer represented by Formula 1, the spreadability of the low refractive layer LRL can be secured to minimize or reduce a step difference due to a member thereunder. For example, a color difference due to a thickness distribution of the color conversion layer CCL and/or the color filter layer CFL can be improved, thereby improving display quality of the display panel PNL. In addition, a separate planarization layer for decreasing a step difference may be removed or omitted, thereby minimizing or reducing a thickness of the display panel PNL to improve light efficiency.

The color filter layer CFL may be on the low refractive layer LRL. The color filter layer CFL may include a color filter corresponding to a color of each pixel PXL. For example, the color filter layer CFL may include a first color filter CF1 on the first pixel PXL1 to selectively transmit light generated in the first pixel PXL1, a second color filter CF2 on the second pixel PXL2 to selectively transmit light generated in the second pixel PXL2, and a third color filter CF3 on the third pixel PXL3 to selectively transmit light generated in the third pixel PXL3. In one exemplary embodiment, the first color filter CF1, the second color filter CF2, and the third color filter CF3 may be a red color filter, a green color filter, and a blue color filter, respectively but are not limited thereto. Hereinafter, when a color filter of the first color filter CF1, the second color filter CF2, and the third color filter CF3 is arbitrarily described, the color filter will be referred to as "color filter," or when at least two color filters thereof are collectively described, the color filters will be referred to as "color filters CF."

The first color filter CF1 may overlap the emission area EMA of the first pixel PXL1 and may include a color filter material that selectively transmits first color light. For example, when the first pixel PXL1 is a red color pixel, the first color filter CF1 may include a red color filter material.

The second color filter CF2 may overlap the emission area EMA of the second pixel PXL2 and may include a color filter material that selectively transmits the second color light. For example, when the second pixel PXL2 is a green color pixel, the second color filter CF2 may include a green color filter material.

The third color filter CF3 may overlap the emission area EMA of the third pixel PXL3 and may include a color filter material that selectively transmits the third color light. For example, when the third pixel PXL3 is a blue color pixel, the third color filter CF3 may include a blue color filter material.

A black matrix BM may be between the color filters CF. The black matrix BM may be in a boundary area between the pixel areas PXA so as to not overlap each emission area EMA. For example, the black matrix BM may overlap the second bank BNK2.

The black matrix BM may include at least one black matrix material (for example, at least one suitable light blocking material generally used in the art) selected from various types (or kinds) of black matrix materials, and/or a color filter material having a set or specific color. In addition, the black matrix BM may be made of the same (e.g., substantially the same) material as the second bank BNK2, but the present disclosure is not limited thereto. For example, the black matrix BM and the second bank BNK2 may include the same (e.g., substantially the same) material or different materials. In some embodiments, the black matrix BM may be removed or omitted according to exemplary embodiments. In this case, the first to third color filters CF1, CF2, and CF3 may overlap each other at a boundary between the pixel areas PXA.

An encapsulation layer ENC may be on the color filter layer CFL. The encapsulation layer ENC may cover the color filter layer CFL, the color conversion layer CCL, the display layer DPL, and the circuit layer PCL thereunder. The encapsulation layer ENC may prevent or reduce permeation moisture and/or air into the above-described members thereunder. To this end, the encapsulation layer ENC may include at least one inorganic layer. For example, the inorganic layer may include at least one selected from silicon nitride ($SiN_x$), aluminum nitride (AlN$_x$), titanium nitride (TiN$_x$), silicon oxide (SiO$_x$), aluminum oxide (AlO$_x$), titanium oxide (TiO$_x$), and silicon oxynitride (SiO$_x$N$_y$), but the present disclosure is not necessarily limited thereto. In addition, the encapsulation layer ENC may protect the above-describe members thereunder from foreign substances such as dust. To this end, the encapsulation layer ENC may include at least one organic layer. For example, the organic layer may be made of an acrylic resin, an epoxy resin, a phenolic resin, a polyamide resin, and/or a polyimide resin, but the present disclosure is not necessarily limited thereto. As described above, when the encapsulation layer ENC is on the color filter layer CFL, because a separate upper substrate may be removed or omitted, a thickness of the display panel PNL can be minimized or reduced to improve light efficiency.

According to exemplary embodiments, capping layers CP1 and CP2 may be further on one surface and another surface, respectively, of the low refractive layer LRL. The capping layers CP1 and CP2 may include a first capping layer CP1 and a second capping layer CP2 respectively on the one surface and the other surface, respectively, of the low refractive layer LRL.

The first capping layer CP1 may be between the color conversion layer CCL and the low refractive layer LRL. The first capping layer CP1 may be over the first to third pixels PXL1, PXL2, and PXL3. The first capping layer CP1 may seal the color conversion layer CCL. Accordingly, it is possible to prevent or reduce permeation of impurities such as external moisture and/or air into the color conversion layer CCL to damage or contaminate the color conversion layer CCL. The first capping layer CP1 may be an inorganic layer and may be made of at least one selected from silicon nitride (SiN$_x$), aluminum nitride (AlN$_x$), titanium nitride (TiN$_x$), silicon oxide (SiO$_x$), aluminum oxide (AlO$_x$), titanium oxide (TiO$_x$), and silicon oxynitride (SiO$_x$N$_y$).

The second capping layer CP2 may be between the low refractive layer LRL and the color filter layer CFL. The second capping layer CP2 may be over the first to third pixels PXL1, PXL2, and PXL3. The second capping layer CPL2 may prevent or reduce permeation of impurities such as external moisture and/or air into the color filter layer CFL and/or the color conversion layer CCL to damage or contaminate the color filter layer CFL and/or the color conversion layer CCL. In addition, the second capping layer CP2 may prevent or reduce diffusion of a colorant included in the color filter layer CFL into other components. The second capping layer CP2 may be an inorganic layer and may be made of the same (e.g., substantially the same) material as the first capping layer CP1 or may include at least one selected from the materials exemplified as the structural materials of the first capping layer CP1.

According to the display device according to the exemplary embodiment described above, because the low refractive layer LRL includes a set or predetermined content (e.g., amount or weight) of the monomer represented by Formula 1, the spreadability of the low refractive layer LRL can be secured to minimize or reduce the step difference due to the member thereunder. For example, a color difference due to a thickness distribution of the color conversion layer CCL and/or the color filter layer CFL can be improved, thereby improving display quality of the display panel PNL. In addition, a separate planarization layer for decreasing a step difference may be removed or omitted, thereby minimizing or reducing a thickness of the display panel PNL to improve light efficiency.

Hereinafter, other exemplary embodiments will be described. In the following exemplary embodiments, the same components as the above-described components will be denoted by the same reference numerals, and repetitive descriptions thereof will not be repeated here or will be simplified.

Figure 10:
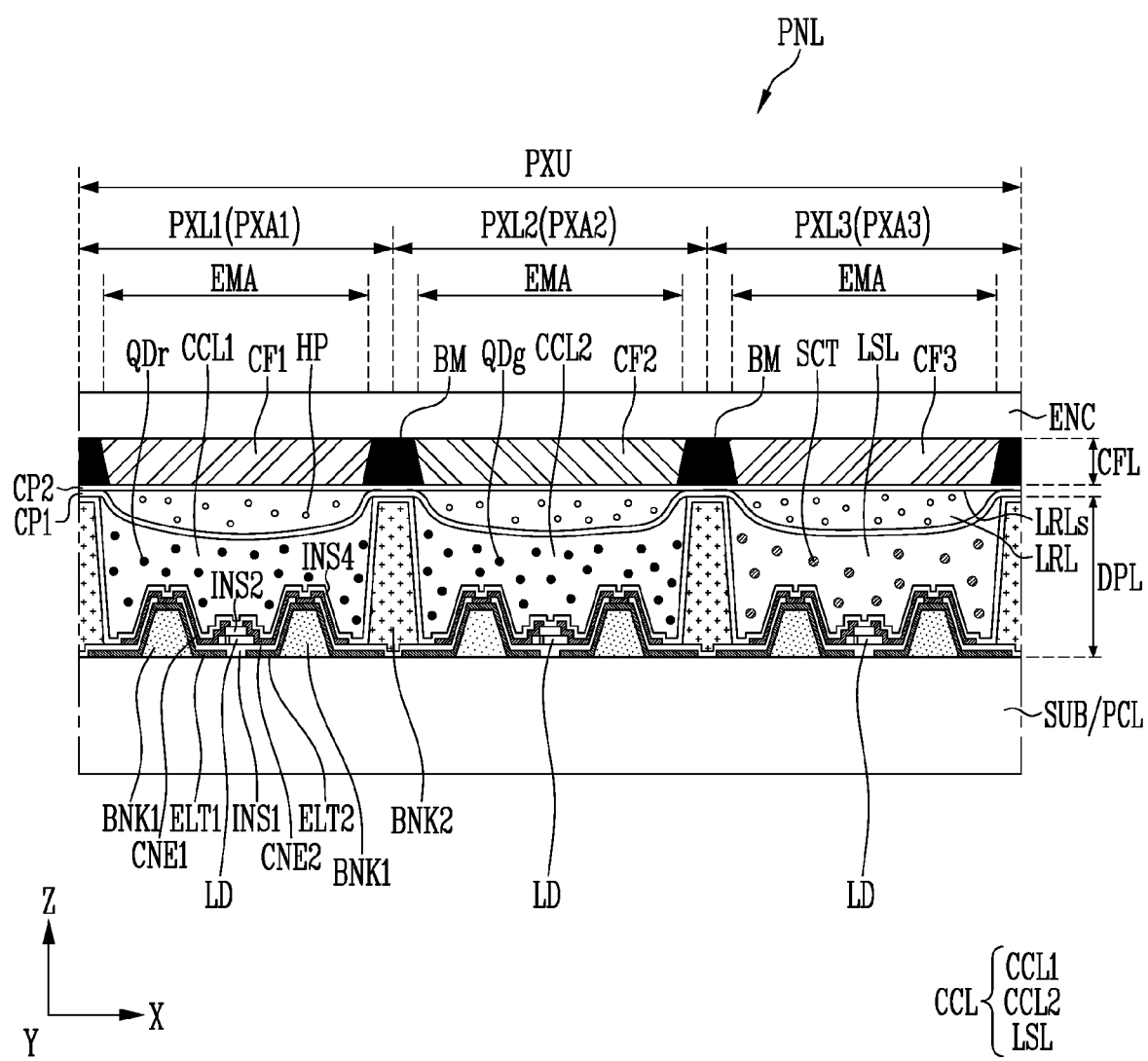
FIG. 10 is a cross-sectional view illustrating a display device according to another exemplary embodiment.

FIG. 10 is a cross-sectional view illustrating a display device according to another exemplary embodiment.

Referring to FIG. 10, the display device according to the present exemplary embodiment is different from the exemplary embodiments of FIGS. 1 to 9 in that a low refractive layer LRL is in a region partitioned by a second bank BNK2.

In some embodiments, the low refractive layer LRL may be inside the second bank BNK2 and may be partially in each of first to third pixel areas PXA1, PXA2, and PXA3.

In this case, because the color conversion layer CCL is formed to have a height lower than that of the second bank BNK2, even when a set or predetermined step difference is formed between the color conversion layer CCL and the second bank BNK2, the low refractive layer LRL may be inside the region partitioned by the second bank BNK2, thereby minimizing or reducing the step difference due to the color conversion layer CCL. Therefore, a color difference due to a thickness distribution of the color conversion layer CCL and/or the color filter layer CFL can be improved, thereby improving display quality of a display panel PNL. In addition, a separate planarization layer for decreasing a step difference may be removed or omitted, thereby minimizing or reducing a thickness of the display panel PNL to improve light efficiency as described above.

In addition, because the low refractive layer LRL, the color conversion layer CCL, and the color filter layer CFL have been described with reference to FIG. 7, duplicative descriptions thereof will not be repeated here.

Figure 11:
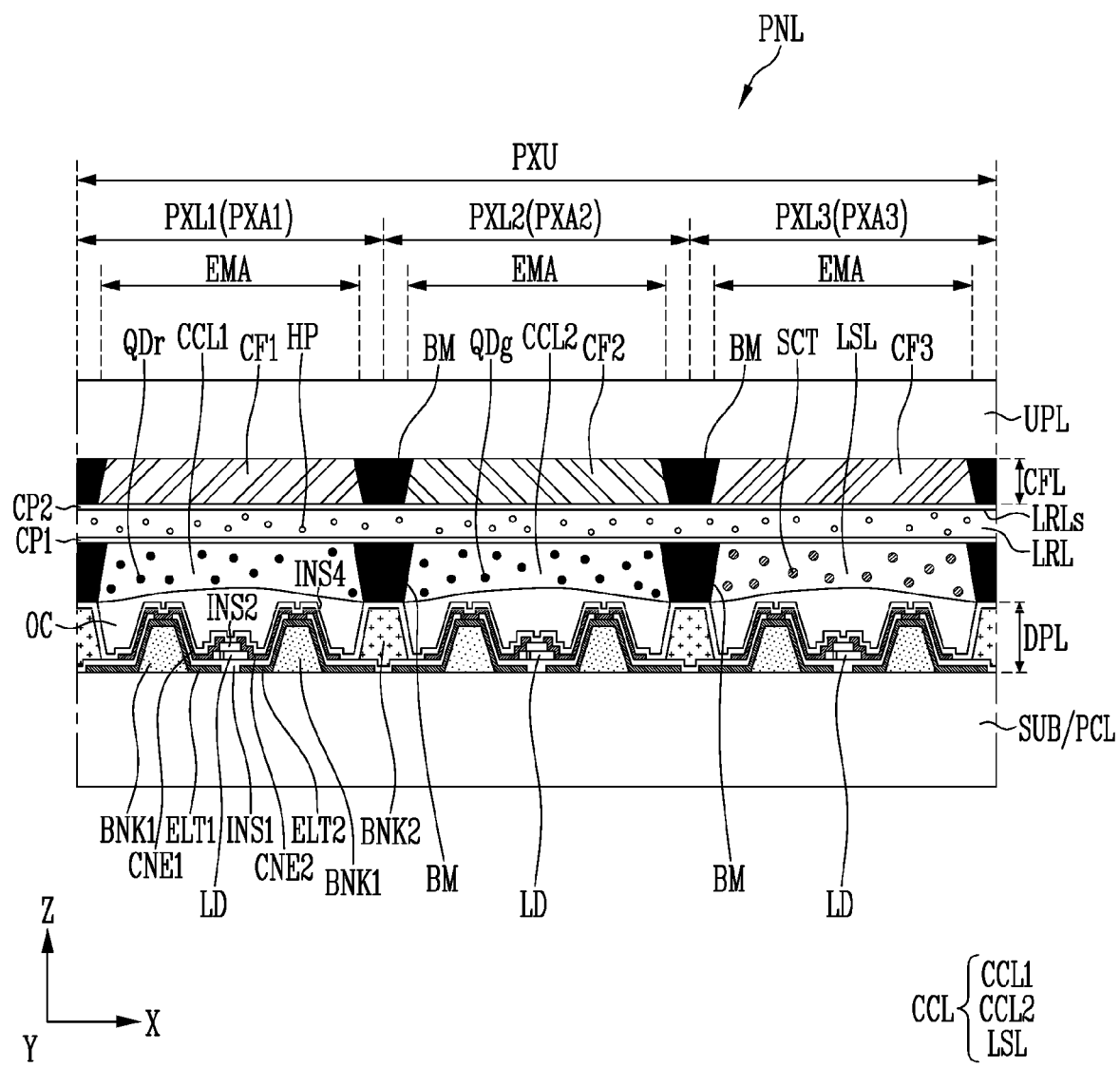
FIG. 11 is a cross-sectional view illustrating a display device according to still another exemplary embodiment.

FIG. 11 is a cross-sectional view illustrating a display device according to still another exemplary embodiment.

Referring to FIG. 11, the display device according to the present exemplary embodiment is different from the exemplary embodiments of FIGS. 1 to 9 in that an upper substrate UPL is on a substrate SUB on which a pixel unit PXU is located.

In some embodiments, the upper substrate UPL (also referred to as an "encapsulation substrate" or a "color filter substrate") configured to encapsulate first to third pixels PXL1, PXL2, and PXL3 may be on one surface of the substrate SUB.

The upper substrate UPL may include a color filter layer CFL, a low refractive layer LRL, and a color conversion layer CCL overlapping the first to third pixels PXL1, PXL2, and PXL3.

In one exemplary embodiment, a space between a lower plate of a display panel PNL including the substrate SUB and a display layer DPL, and an upper plate of the display panel PNL including the upper substrate UPL, the color filter layer CFL, the low refractive layer LRL, and the color conversion layer CCL may be filled with an overcoat layer OC and/or an air layer having a relatively low refractive index in a range of about 1 to about 1.6. According to exemplary embodiments, an inorganic layer may be further between the color conversion layer CCL and the overcoat layer OC. The inorganic layer may prevent or reduce permeation of impurities such as moisture and/or air into the color conversion layer CCL. The inorganic layer may be made of at least one selected from silicon nitride (SiN$_x$), aluminum nitride (AlN$_x$), titanium nitride (TiN$_x$), silicon oxide (SiO$_x$), aluminum oxide (AlO$_x$), titanium oxide (TiO$_x$), and silicon oxynitride (SiO$_x$N$_y$), but the present disclosure is not necessarily limited thereto.

The color filter layer CFL, the low refractive layer LRL, and the color conversion layer CCL may be on one surface of the upper substrate UPL. For example, the color filter layer CFL may be formed on the upper substrate UPL, the low refractive layer LRL may be formed on the color filter layer CFL, and the color conversion layer CCL may be formed on the color filter layer CFL and the low refractive layer LRL. However, the present disclosure is not necessarily limited thereto, and the order of forming the color filter layer CFL, the low refractive layer LRL, and the color conversion layer CCL and/or the shape according to the order may be variously changed.

According to exemplary embodiments, a black matrix BM may be between a first color filter CF1, a second color filter CF2, and a third color filter CF3. The black matrix BM may be at a boundary between pixel areas PXA so as to not cover each emission area EMA. For example, the black matrix BM may overlap a second bank BNK2. In FIG. 11, a case is illustrated in which the black matrix BM is on the upper substrate UPL and each of the first to third color filters CF1, CF2, and CF3 is respectively in a region partitioned by the black matrix BM, but the present disclosure is not necessarily limited thereto. In some embodiments, the first to third color filters CF1, CF2, and CF3 may be formed on the upper substrate UPL, and the black matrix BM may be formed at the boundary between the pixel areas PXA. For example, the order of forming the color filter layer CFL and/or the position and/or shape according to the order may be variously changed according to exemplary embodiments.

According to exemplary embodiments, the black matrix BM may be further between a first color conversion layer CCL1, a second color conversion layer CCL2, and a light scattering layer LSL. In FIG. 11, a case is illustrated in which the black matrix BM is on the low refractive layer LRL (or first capping layer CP1) and each of the first color conversion layer CCL1, the second color conversion layer CCL2, and the light scattering layer LSL is in a region partitioned by the black matrix BM, but the present disclosure is not necessarily limited thereto. For example, when there is no need to first form the black matrix BM according to a process method and/or performance of a printing facility, the first color conversion layer CCL1, the second color conversion layer CCL2, and the scattering layer LSL may be first formed, and then, the black matrix BM may be formed. In some embodiments, the order of forming the color conversion layer CCL and/or the position and/or shape according to the order may be variously changed.

In addition, because the color filter layer CFL, the low refractive layer LRL, and the color conversion layer CCL have been described with reference to FIG. 7, duplicative descriptions thereof will not be repeated here.

According to the exemplary embodiment of the present disclosure, it is possible to secure spreadability of a low refractive layer to minimize or reduce a step difference due to a member thereunder. For example, a color difference due to a thickness distribution of a color conversion layer and/or a color filter layer can be improved, thereby improving display quality of a display panel. In addition, a separate planarization layer for decreasing a step difference can be removed or omitted, thereby minimizing or reducing a thickness of the display panel to improve light efficiency.

Effects of embodiments of the present disclosure are not restricted to the exemplary embodiments set forth herein and more additional effects and embodiments are included in this specification.

It will be apparent to those skilled in the art to which the exemplary embodiments of the present disclosure pertain that a variety of modifications are possible without departing from the essential characteristics of the present disclosure. Therefore, the above-described methods shall be interpreted as being illustrative while not being limitative. It should be understood that the scope of the present disclosure shall be defined by the appended claims, and all equivalents thereof fall within the scope of the present disclosure.

What is claimed is:
1. A display device comprising:
pixels, wherein the pixels comprise:
a plurality of banks wherein each bank includes an opening overlapping each of the pixels;
a plurality of light-emitting elements in the respective openings of the plurality of banks;
a color conversion layer on the light-emitting elements in the respective openings of the plurality of banks; and
a low refractive layer on a top surface of the color conversion layer and a top surface of the plurality of banks,
wherein the low refractive layer includes a monomer represented by Formula 1 below:

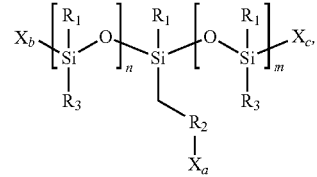

Formula 1 wherein, in Formula 1, $R_1$ and $R_3$ are each independently hydrogen, an alkyl group, or a substituted alkyl group, $R_2$ is an alkyl group or a substituted alkyl group having two or more carbon atoms, $X_a$ consists of at least one selected from a methacrylate group, an acrylate group, a vinyl group, and an epoxy group, $X_b$, and $X_c$ are each independently a curable functional group, and n and m are each independently a natural number in a range of 1 to 5.

2. The display device of claim 1, wherein the monomer is included in a content in a range of 3 wt % to 10 wt % with respect to 100 wt % of a solid content of the low refractive layer.

3. The display device of claim 1, wherein the low refractive layer further includes hollow particles.

4. The display device of claim 3, wherein the hollow particles are included in a content in a range of 10 wt % to 80 wt % with respect to 100 wt % of a solid content of the low refractive layer.

5. The display device of claim 1, wherein the curable functional group of $X_b$, and $X_c$ each independently includes at least one selected from a methacrylate group, an acrylate group, a vinyl group, and an epoxy group.

6. The display device of claim 1, further comprising an inorganic layer between the color conversion layer and the low refractive layer.

7. The display device of claim 1, further comprising a color filter layer overlapping the color conversion layer, wherein the low refractive layer is between the color conversion layer and the color filter layer.

8. The display device of claim 7, further comprising an inorganic layer between the color filter layer and the low refractive layer.

9. The display device of claim 8, wherein the inorganic layer includes at least one selected from silicon oxide ($SiO_x$), silicon nitride ($SiN_x$), silicon oxynitride ($SiO_xN_y$), aluminum oxide ($AlO_x$), and titanium oxide ($TiO_x$).

10. The display device of claim 1, wherein the color conversion layer includes a base resin and quantum dots dispersed in the base resin.

11. The display device of claim 1, wherein each of the light-emitting elements includes:
- a first semiconductor layer;
- a second semiconductor layer on the first semiconductor layer; and
- an active layer between the first semiconductor layer and the second semiconductor layer.

\* \* \* \* \*